United States Patent
Suzuki et al.

(10) Patent No.: US 8,927,193 B2
(45) Date of Patent: Jan. 6, 2015

(54) COLORING PHOTOSENSITIVE COMPOSITION, LITHOGRAPHIC PRINTING PLATE PRECURSOR AND PLATE MAKING METHOD

(75) Inventors: Shota Suzuki, Haibara-gun (JP); Toshihide Aoshima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/636,037

(22) PCT Filed: Mar. 15, 2011

(86) PCT No.: PCT/JP2011/056085
§ 371 (c)(1),
(2), (4) Date: Sep. 19, 2012

(87) PCT Pub. No.: WO2011/115125
PCT Pub. Date: Sep. 22, 2011

(65) Prior Publication Data
US 2013/0011791 A1    Jan. 10, 2013

(30) Foreign Application Priority Data
Mar. 19, 2010 (JP) ................................. 2010-065206

(51) Int. Cl.
| G03F 7/00 | (2006.01) |
| G03F 7/26 | (2006.01) |
| G03C 1/72 | (2006.01) |
| G03F 7/033 | (2006.01) |
| G03F 7/027 | (2006.01) |
| G03F 7/105 | (2006.01) |
| B41C 1/10 | (2006.01) |

(52) U.S. Cl.
CPC ............... *G03F 7/033* (2013.01); *G03F 7/027* (2013.01); *G03F 7/105* (2013.01); *B41C 1/1008* (2013.01); *B41C 1/1016* (2013.01); *B41C 2201/02* (2013.01); *B41C 2201/04* (2013.01); *B41C 2201/10* (2013.01); *B41C 2201/12* (2013.01); *B41C 2201/14* (2013.01); *B41C 2210/04* (2013.01); *B41C 2210/08* (2013.01); *B41C 2210/22* (2013.01); *B41C 2210/24* (2013.01); *B41C 2210/26* (2013.01); *B41C 2210/266* (2013.01)
USPC ...................... 430/270.1; 430/138; 430/270.2; 430/302

(58) Field of Classification Search
CPC ............. G03F 7/00; G03F 7/004; G03F 7/20; G03F 7/032
USPC ............ 430/138, 270.1, 302; 101/450.1, 453, 101/463.1
See application file for complete search history.

(56) References Cited

U.S. PATENT DOCUMENTS

| 6,521,753 | B1 | 2/2003 | Carreira et al. |
| 2001/0018159 | A1 | 8/2001 | Maemoto |
| 2002/0087010 | A1 | 7/2002 | Carreira et al. |
| 2002/0177074 | A1 | 11/2002 | Hoshi et al. |
| 2003/0064318 | A1 | 4/2003 | Huang et al. |
| 2003/0073025 | A1* | 4/2003 | Takashima et al. ........... 430/138 |
| 2003/0129522 | A1 | 7/2003 | Oohashi et al. |
| 2004/0106060 | A1 | 6/2004 | Maemoto |
| 2004/0214105 | A1 | 10/2004 | Hoshi et al. |
| 2004/0224258 | A1 | 11/2004 | Maemoto |
| 2004/0234883 | A1 | 11/2004 | Maemoto |
| 2006/0024612 | A1 | 2/2006 | Oshima et al. |
| 2007/0056457 | A1 | 3/2007 | Iwai et al. |
| 2011/0045408 | A1* | 2/2011 | Suzuki et al. .............. 430/281.1 |

FOREIGN PATENT DOCUMENTS

| CN | 1924703 A | 3/2007 |
| EP | 1 621 338 A1 | 2/2006 |
| EP | 1 685 957 A2 | 8/2006 |
| JP | 11-277927 A | 10/1999 |
| JP | 2000-335129 A | 12/2000 |
| JP | 2001-277740 A | 10/2001 |
| JP | 2001-277742 A | 10/2001 |
| JP | 2002-287334 A | 10/2002 |
| JP | 2003-191657 A | 7/2003 |
| JP | 2003-535095 A | 11/2003 |
| JP | 2006-30342 A | 2/2006 |
| JP | 2006030342 A * | 2/2006 |
| JP | 2006-247856 A | 9/2006 |
| JP | 2006-264306 A | 10/2006 |
| JP | 2007-90850 A | 4/2007 |
| JP | 2008-195018 A | 8/2008 |

OTHER PUBLICATIONS

International Search Report, dated Apr. 12, 2011, issued in PCT/JP2011/056085.
Forms PCT/IB/373 and PCT/ISA/237, mailed Oct. 23, 2012, for International Application No. PCT/JP2011/056085.
Forms PCT/IB/373 and PCT/ISA/237, mailed Sep. 25, 2012, for International Application No. PCT/JP2011/056085.
Chinese Office Action dated Nov. 20, 2013 issued in corresponding Chinese Patent Application No. 201180014759.X.
Extended European Search Report dated Jan. 2, 2014 issued in corresponding European Patent Application No. 11756310.6.
Chinese Office Action for Appliance No. 201180014759.X dated May 8, 2014 (w/English translation).

* cited by examiner

*Primary Examiner* — Chanceity Robinson
(74) *Attorney, Agent, or Firm* — Birch, Stewart, Kolasch & Birch, LLP

(57) ABSTRACT

To provide a coloring photosensitive composition and a lithographic printing plate precursor, ensuring that coloring stability after exposure by infrared laser exposure is good and high coloring is obtained even when exposed after the elapse of time. These can be a coloring photosensitive composition containing a microgel encapsulating (A) a polymer having a glass transition temperature of 50° C. or more, (B) a photoinitiator, and (C) an infrared absorbing dye, and a lithographic printing plate precursor having an image-recording layer containing the composition.

20 Claims, No Drawings

COLORING PHOTOSENSITIVE COMPOSITION, LITHOGRAPHIC PRINTING PLATE PRECURSOR AND PLATE MAKING METHOD

TECHNICAL FIELD

The present invention relates to a coloring photosensitive composition, a lithographic printing plate precursor applying the coloring photosensitive composition to an image-recording layer, and a plate making method using the same. More specifically, the present invention relates to a lithographic printing plate precursor capable of directly making a plate by imagewise exposure using a laser, and a plate making method including on-press development of the lithographic printing plate precursor.

BACKGROUND ART

In general, a lithographic printing plate consists of an ink-receptive image area for receiving an ink in the printing process and a hydrophilic non-image area for receiving a fountain solution. Lithographic printing is a method utilizing the nature of water and oily ink repelling each other, where the ink-receptive image area and the hydrophilic non-image area of a lithographic printing plate are used as an ink-receiving area and a fountain solution-receiving area (a non-ink-receiving area), respectively, to make a difference in adherence of the ink on the surface of the lithographic printing plate and after depositing the ink only on the image area, the ink is transferred to a printing material such as paper, thereby performing the printing.

For producing such a lithographic printing plate, conventionally, a lithographic printing plate precursor (PS plate) comprising a hydrophilic support having provided thereon an ink-receptive photosensitive resin layer (image recording layer) has been used, and a lithographic printing plate has been obtained by exposing the PS plate through a mask such as lith film and then performing a development processing with an alkaline developer or the like to dissolve and remove the unnecessary image-recording layer corresponding to the non-image area while leaving the image-recording layer corresponding to the image area.

The recent progress in this field makes it possible to obtain the lithographic printing plate by a CTP (computer-to-plate) technology at present. That is, a lithographic printing plate precursor is directly scanned and exposed without the intervention of a lith film by using a laser or a laser diode and then developed, whereby a lithographic printing plate is obtained.

With the progress above, the issue related to the lithographic printing plate precursor is changed to improving image-forming characteristics, printing characteristics, physical characteristics and the like responding to the CTP technology. Also, as another issue related the lithographic printing plate precursor, the increasing concern for global environment draws prominent attention to an environmental problem of waste liquid associated with a wet treatment such as development processing.

To cope with the environmental problem above, it is demanded to simplify the development or plate making or eliminate the need for processing. As one of simple plate making methods, a method called "on-press development" is being done. More specifically, this is a method where the lithographic printing plate precursor after exposure is directly loaded on a printing machine without performing conventional development and the unnecessary portion of the image-recording layer is removed at an early stage of the normal printing process.

For such simplification of the plate making work, a system using a lithographic printing plate precursor capable of being handled in a bright room or under a yellow lamp and a light source is preferred in view of ease of working. On this account, as for the light source, a semiconductor laser emitting an infrared ray with a wavelength of 760 to 1,200 nm or a solid laser such as YAG laser is used. A UV laser can be also used.

As regards the on-press developable lithographic printing plate precursor, for example, a lithographic printing plate precursor comprising a hydrophilic support having provided thereon an image-recording layer (heat-sensitive layer) containing a microcapsule encapsulating a polymerizable compound is described in Patent documents 1 and 2. Also, a lithographic printing plate precursor comprising a support having provided thereon an image-recording layer (photosensitive layer) containing an infrared absorbing dye, a radical polymerization initiator and a polymerizable compound is described in Patent Document 3. Furthermore, an on-press developable lithographic printing plate precursor comprising a support having provided thereon an image-recording layer containing a polymerizable compound and a graft polymer having a polyethylene oxide chain in the side chain or a block polymer having a polyethylene oxide block is described in Patent Document 4.

In general, an operation (plate inspection) to inspect or discriminate the image on the printing plate for checking whether the intended image recording is made on the printing plate is performed as a pre-step before loading the printing plate on a printing machine. In the case of a normal lithographic printing plate precursor involving a development processing step, a stained image is generally obtained by development processing when the image-recording layer is colored, and therefore, it is easy to confirm the image before loading the printing plate on a printing machine.

However, in the case of a lithographic printing plate precursor of an on-press development type or a non-processing (non-development) type, which is not subjected to development processing, the printing plate at the stage of loading the printing plate on a printing machine has no image thereon, and plate inspection cannot be performed. In particular, whether a registry guide (register mark) as a registration landmark in multicolor printing can be distinguished or not is important for printing work. For this reason, the lithographic printing plate precursor of an on-press development type or a non-processing (non-development) type is required to provide means for confirming the image, that is, produce a so-called print-out image resulting from coloring or decoloring in the exposed region, at the stage of being exposed. Furthermore, from the standpoint of enhancing the workability, it is also required that the exposed region involved in coloring or decoloring is not changed even after the elapse of time and keeps the colored or decolored state.

A lithographic printing plate precursor using, as the print-out agent, a compound capable of generating an acid, a base or a radical by light or heat and a compound capable of interacting with the generated acid, base or radical to cause color change has been proposed (see, for example, Patent Document 5). Also, it has been proposed to utilize the change in color of a thermally decomposable compound as the print-out agent of a direct-drawing type lithographic printing plate precursor having a heat-sensitive layer (see, for example, Patent Document 6). Furthermore, it has been also proposed to use a thermally decomposable dye having a thermal decomposition temperature of 250° C. or less as the print-out agent (see, for example, Patent Document 7).

According to these techniques, coloring or decoloring occurs in the exposed area, and the suitability for plate inspection is enhanced to some extent, but this is still insufficient.

In Patent Document 8, it is stated that a print-out image having good visibility and being at a level allowing plate inspection is obtained by a system containing an infrared absorbing dye of a cyanine dye type having a 5-membered ring in the methine chain and a radical generator. However, this technique is insufficient in terms of maintaining good visibility even after the elapse of time.

PRIOR ART DOCUMENTS

Patent Document

Patent Document 1: JP-A-2001-277740
Patent Document 2: JP-A-2001-277742
Patent Document 3: JP-A-2002-287334
Patent Document 4: U.S. Patent Application Publication No. 2003/0064318, description
Patent Document 5: JP-A-11-277927
Patent Document 6: JP-A-2000-335129
Patent Document 7: JP-A-2003-191657
Patent Document 8: JP-A-2007-090850

SUMMARY OF THE INVENTION

Problems that the Invention is to Solve

An object of the present invention is to provide a coloring photosensitive composition and a color image forming method, ensuring high coloring by infrared laser exposure, little color fading after coloring, and good storage stability. Another object is to provide a lithographic printing plate precursor containing the composition as an image-recording layer, which exhibits good storage stability, high suitability for plate inspection, and long press life and does not require a development step.

Means for Solving the Problems

1. A coloring photosensitive composition comprising a microgel encapsulating the following (A) to (C), and a binder polymer:
(A) a polymer having a glass transition temperature of 50° C. or more,
(B) a photoinitiator, and
(C) an infrared absorbing dye.

2. The coloring photosensitive composition as described in 1 above, wherein the infrared absorbing dye contains, in the molecule, at least any one selected from the group consisting of a hydroxy group, an amino group, an isocyanate group and a terminal ethylenically unsaturated bonding group.

3. The coloring photosensitive composition as described in 1 or 2 above, wherein the infrared absorbing dye is a cyanine dye.

4. The coloring photosensitive composition as described in 3 above, wherein the infrared absorbing dye is a cyanine dye represented by the following formula (1):

Formula (1):

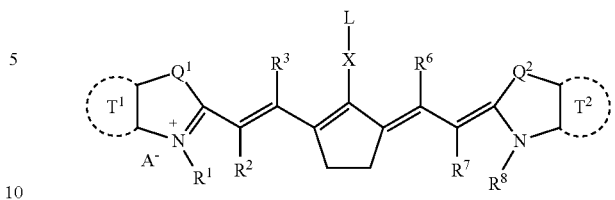

wherein $R^1$ and $R^8$ represent a monovalent substituent; each of $R^2$, $R^3$, $R^6$ and $R^7$ independently represents a hydrogen atom or a hydrocarbon group; X represents an oxygen atom, a nitrogen atom or a sulfur atom; L represents an aromatic hydrocarbon ring, a heteroaromatic ring or a heteroatom-containing alkyl group having a carbon atom number of 1 to 12, provided that when X is a nitrogen atom, —N(L1)(L2) results, and L1 and L2 may be the same or different and represent the same substituent as L; $Q^1$ and $Q^2$ may be the same or different and represent —NR$^9$—, a sulfur atom, an oxygen atom or a dialkylmethylene group, and $R^9$ represents a hydrogen atom or a hydrocarbon group which may have a substituent; each of $T^1$ and $T^2$ independently represents an aromatic ring or a heteroaromatic ring, and the ring may further have a substituent; A– represents a counter ion; and in the molecule, at least one of $T^1$, $T^2$, $R^1$, $R^8$ and L has a hydroxy group, an amino group, an isocyanate group, or a terminal ethylenically unsaturated bonding group.

5. The coloring photosensitive composition as described in any one of 1 to 4 above, wherein the photoinitiator is an iodonium salt or a sulfonium salt.

6. The coloring photosensitive composition as described in 5 above, wherein the photoinitiator has, in the molecule, at least any one selected from the group consisting of a hydroxy group, an isocyanate group and a terminal ethylenically unsaturated bonding group.

7. The coloring photosensitive composition as described in any one of 1 to 6 above, wherein the microgel further encapsulates (D) an acid color former.

8. The coloring photosensitive composition as described in 7 above, wherein the acid color former (D) is at least one compound selected from the group consisting of a spiropyran compound and a spirooxazine compound.

9. The coloring photosensitive composition as described in 8 above, wherein the spiropyran compound and the spirooxazine compound have, in the molecule, at least any one selected from the group consisting of a hydroxy group, an amino group, an isocyanate group and a terminal ethylenically unsaturated bonding group.

10. A lithographic printing plate precursor comprising, in order, a support and an image-recording layer containing the coloring photosensitive composition described in any one of 1 to 9 above.

11. The lithographic printing plate precursor as described in 10 above, wherein the image-recording layer further contains, outside the microgel, (B) a photoinitiator, (C) an infrared absorbing dye, and (E) a polymerizable compound.

12. The lithographic printing plate precursor as described in 11 above, comprising a protective layer on the image-recording layer.

13. The lithographic printing plate precursor as described in 12 above, wherein the protective layer contains an inorganic layered compound.

14. A color image forming method comprising imagewise-exposing the coloring photosensitive composition described in any one of 1 to 9 above to cause coloring of the exposed area.

15. A plate making method comprising imagewise-exposing the lithographic printing plate precursor described in any one of 10 to 13 above to cause coloring of the exposed area, and then performing development processing.

16. A plate making method comprising performing on-press development processing by either a method where the lithographic printing plate precursor described in any one of 10 to 13 above is imagewise-exposed to cause coloring of the exposed area and then loaded on a printing machine and thereafter, a printing ink and a fountain solution are supplied, or a method where the lithographic printing plate precursor is loaded on a printing machine and then imagewise-exposed and thereafter, a printing ink and a fountain solution are supplied.

In the present invention, (A) a polymer having a glass transition temperature of 50° C. or more, (B) a photoinitiator, and (C) an infrared absorbing dye are encapsulated in a microgel and after coating the microgel on a support together with a binder polymer, the coating film is exposed to an infrared laser, whereby a color image enjoying good coloring and little color fading with aging can be formed. By further encapsulating (D) an acid color former in the microgel, a good color image enjoying higher coloring and little color fading with aging can be formed.

Also, in the present invention, an image-recording layer containing, outside the microgel particle, (B) a photoinitiator, (C) an infrared absorbing dye and (E) a polymerizable compound, which may be the same as or different from those within the particle, is formed by coating on a support and then imagewise exposed using an infrared laser, whereby a lithographic printing plate improved in the suitability for plate inspection, press life, storage stability and on-press developability can be obtained.

The coloring mechanism in the present invention is not necessarily clarified but is presumed as follows. It is considered that an efficient electron transfer reaction takes place due to a reaction of the infrared absorbing dye (C) excited by infrared laser exposure with the photoinitiator (B), leading to expression of a polymerization initiation ability, and at the same time, the infrared absorbing dye (C) is caused to undergo a structural change by the electron transfer, as a result, an efficient color change occurs. It is also considered that thanks to encapsulation together with (A) a polymer having a glass transition temperature of 50° C. or more, the color material produced in the reaction above can be highly stabilized based on reduction in mobility of the color material. In the color image formation based on this mechanism, a sufficient suitability for plate inspection is obtained even without using a colorant that has been required in conventional plates, but when (D) an acid color former is used and encapsulated in the microgel together with (A) a polymer having a glass transition temperature of 50° C. or more, (B) a photoinitiator and (C) an infrared absorbing dye, good storage stability and good coloring enjoying little color fading with aging can be exhibited as compared with a case of not encapsulating (A) a polymer having a glass transition temperature of 50° C. or more. This is considered to result because (A) a polymer having a glass transition temperature of 50° C. or more is present around and in turn, the acid color former (D) has a decreased probability of contacting with a factor in impairing coloring, that is, water or an acid component in the system.

Advantage of the Invention

According to the present invention, a coloring photosensitive composition and a color image forming method, ensuring that good coloring enjoying improved storage stability and little color fading with aging is obtained by infrared laser exposure, can be provided. Also, a lithographic printing plate precursor and a plate making method, ensuring good storage stability, high suitability for plate inspection, and long press life and requiring no development step, can be provided.

MODE FOR CARRYING OUT THE INVENTION

[Coloring Photosensitive Composition]

The coloring photosensitive composition of the present invention is characterized by comprising a microgel encapsulating the following (A) to (C), and a binder polymer:

(A) a polymer having a glass transition temperature of 50° C. or more, (B) a photoinitiator, and (C) an infrared absorbing dye.

This composition causes coloring of the exposed area by infrared laser exposure, whereby an image with high visibility is formed. The colored image undergoes little color fading/deterioration even when the time is elapsed, and furthermore, the coloring performance of the composition is not deteriorated with aging, revealing good storage stability.

Respective components of the coloring photosensitive composition of the present invention are described below.

[Microgel]

In the present invention, a microgel (crosslinked polymer fine particle) is used as a particle. As for the method to form a microgel, a known method can be applied. Other fine particles include, for example, a polymer fine particle and a microcapsule encapsulating a hydrophobic compound, but in the case of a polymer fine particle, the inclusions described in the present invention can be hardly dissolved at a high concentration in the core monomer used as the main component and in the case of a microcapsule, elution of the inclusions occurs during preparation of the photosensitive solution containing an organic solvent or after coating the solution. Thus, application of these fine particles is difficult. In the case of a microgel, a low boiling-point solvent (e.g., methyl ethyl ketone) capable of highly dissolving the inclusions in the synthesis stage and volatilizing after synthesis can be selected, and therefore, the present invention has been accomplished.

The microgel for use in the present invention includes the following microgel (1) and microgel (2). By using such a microgel, a lithographic printing plate precursor where the organic solvent-containing coating solution for the image-recording layer exhibits excellent aging stability and moreover, the on-press developability and printing performance are good, can be obtained. In the case where the content of the organic solvent in the coating solvent is 50 mass % or more, the effects of the present invention are more remarkable.

[Microgel (1)]

The microgel (1) is produced by dissolving a polyfunctional isocyanate compound having two or more isocyanate groups in a water-non-miscible solvent, emulsifying/dispersing this solution in an aqueous solution containing a hydrophilic polymer having, at one terminal, one or more active hydrogen groups capable of reacting with an isocyanate group, and removing the solvent from the oil droplet of the liquid emulsion/dispersion.

As for the operation in the production method of the microgel (1), a known method can be applied. That is, an oil phase solution obtained by dissolving an isocyanate compound dissolvable in a water-non-miscible solvent, which is a polyfunctional isocyanate compound having two or more isocyanate functional groups, in a solvent immiscible with water and an aqueous solution containing a hydrophilic polymer having, at one terminal, one or more active hydrogen groups capable of reacting with an isocyanate group are prepared, and these two solutions are combined and mixed with vigorous stirring by using an emulsion disperser such as homogenizer, for example, at 12,000 rpm for 10 to 15 minutes to emulsify/disperse oil droplets in the aqueous phase. The obtained emulsion/dispersion is then heated with stirring to evaporate the solvent, whereby a water dispersion of target microgel particles is obtained.

In the aqueous phase, other than the hydrophilic polymer having, at one terminal, one or more active hydrogen groups capable of reacting with an isocyanate group, a compound having two or more active hydrogen atoms in the molecular is preferably added. Examples of such a compound include water, a polyhydric alcohol-based compound such as ethylene glycol and glycerin, a polyvalent amine-based compound such as ethylenediamine and diethylenetriamine, and a mixture thereof. Furthermore, for enhancing the emulsification and dispersion stability, it is preferred to incorporate a surfactant.

[Polyfunctional Isocyanate]

The polyfunctional isocyanate having two or more isocyanate groups is described below.

Specific examples of such a compound include, as a bifunctional compound having two isocyanate group in the molecule, m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-dimethoxy-biphenyl diisocyanate, 3,3'-dimethyldiphenylmethane-4,4'-diisocyanate, xylylene-1,4-diisocyanate, xylylene-1,3-diisocyanate, 4-chloroxylylene-1,3-diisocyanate, 2-methylxylylene-1,3-diisocyanate, 4,4'-diphenylpropane diisocyanate, 4,4'-diphenylhexafluoropropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,3-diisocyanate, cyclohexylene-1,4-diisocyanate, dicyclohexylmethane-4,4'-diisocyanate, 1,4-bis(isocyanatomethyl)cyclohexane, 1,3-bis(isocyanatomethyl)cyclohexane, isophorone diisocyanate, and lysine diisocyanate.

In the present invention, a trifunctional or higher functional isocyanate compound may be also utilized. Examples of the compound which can be used include a trimer (biuret or isocyanurate) of the above-described bifunctional isocyanate compound as a main raw material, a compound polyfunctionalized as an adduct of a polyol such as trimethylolpropane and a bifunctional isocyanate compound, a formalin condensate of benzene isocyanate, a polymer of an isocyanate compound having a polymerizable group such as methacryloyloxyethyl isocyanate, and lysine triisocyanate. Above all, a trimer (biuret or isocyanurate) of, as a main raw material, xylene diisocyanate or its hydrogenation product, hexamethylene diisocyanate, or tolylene diisocyanate or its hydrogenation product, and a compound polyfunctionalized as an adduct with trimethylolpropane are preferred. These compounds are described in "Polyurethane Resin Handbook" (Keiji Iwata (compiler), published by Nikkan Kogyo Shinbunsha (1987)).

Among these, 2,4-tolylene diisocyanate, 2,6-tolylene diisocyanate, xylylene-1,4-diisocyanate, xylylene-1,3-diisocyanate, and an adduct of trimethylolpropane and xylylene-1,4-diisocyanate or xylylene-1,3-diisocyanate are preferred, and xylylene-1,4-diisocyanate, xylylene-1,3-diisocyanate, and an adduct of trimethylolpropane and xylylene-1,4-diisocyanate or xylylene-1,3-diisocyanate are more preferred.

[Hydrophilic Polymer Having One or More Active Hydrogen Groups at One Terminal]

The hydrophilic polymer having, at one terminal, one or more active hydrogen groups capable of reacting with an isocyanate group is described below. Examples of the active hydrogen group capable of reacting with an isocyanate group include a hydroxyl group, an amino group, a mercapto group, and a carboxy group. Among these, a hydroxyl group and an amino group are preferred. The hydrophilic polymer having such an active hydrogen group is not particularly limited, but examples thereof include a polyether having an active hydrogen group at one terminal.

The mass average molar mass (Mw) of the hydrophilic polymer is preferably from 300 to 500,000, more preferably from 500 to 100,000. By setting Mw to be from 300 to 500,000, the polymer can have an adequate function as a protective colloid and makes it possible to ensure dispersion stability of the microcapsule and obtain sufficient hydrophilicity of the surface.

Specific examples of the hydrophilic polymer include, as a polyether type, a polyethylene oxide and an ethylene oxide/propylene oxide copolymer. These polymers can be synthesized by ring-opening polymerizing a cyclic compound such as ethylene oxide and propylene oxide, with the polymerization initiating terminal being an alcohol, an alkoxide, a carboxylic acid, a carboxylate or the like, and converting the polymerization initiating terminal into an active hydrogen group such as hydroxyl group and amino group through a conventionally known reaction (for example, a hydrolysis reaction or a reduction reaction). A polyether having an active hydrogen group at one terminal can be also utilized. Among these, a monoether form of polyethylene oxide (examples of the monoether include a monomethyl ether and a monoethyl ether), and a monoester form of polyethylene oxide (examples of the monoester include a monoacetic acid ester and a mono(meth)acrylic acid ester) are preferred.

The ratio of the amount used between the polyfunctional isocyanate compound and the hydrophilic polymer is preferably from 100/1 to 100/60, more preferably from 100/2 to 100/30, and most preferably from 100/5 to 100/20, in terms of the molar ratio of the isocyanate functional group to the active hydrogen group. Within the range above, the dispersion stability is good, allowing no reduction in the wall crosslinking density and no leakage of inclusions, and the stain resistance is also good.

[Microgel (2)]

The microgel (2) uses, as the wall material, a polyurea or polyurethane/urea obtained by a polymerization reaction of an isocyanate compound with an active hydrogen-containing compound, where at least one of the isocyanate compound is a reaction product of (1) at least a bifunctional isocyanate compound and (2) a polyether derivative having a terminal amino group or hydroxy group, represented by the following formula (2):

R—O—(-L-)ₙ-(-X-)ₘA-Y    Formula (2):

[In formula (2), X represents a linking group, A represents a single bond, an arylene group or an alkylene group, L represents an alkylene group having a carbon atom number of 2 to 6, R represents an active hydrogen-free organic group, Y represents —OH or —NH₂, m represents 0 or 1, and n indicates the average addition molar number of the polyether group and is a number of 10 to 120.]

The average particle diameter of the microgel above is preferably from 0.01 to 5.0 μm, more preferably from 0.05 to 4.0 μm, still more preferably from 0.10 to 3.0 μm.

The content of the microgel is preferably from 5 to 90 mass % based on the entire solid content of the coloring photosensitive composition.

(A) Polymer having a glass transition temperature of 50° C. or more

As for the (A) polymer having a glass transition temperature (Tg) of 50° C. or more, encapsulated in the microgel characteristic of the present invention, conventionally known polymers can be used without limitation, and a polymer having high hydrophobicity is preferred. Among others, an acrylic resin and a styrene resin are preferred. The polymer may be added simultaneously with other components at the synthesis of the microgel, or the polymer may be formed by adding corresponding monomers and a polymerization initiator and performing a radical polymerization reaction during the synthesis of the microgel. In view of solubility, an encapsulation method of performing a radical polymerization reaction to form a polymer during the synthesis of the microgel is preferred. The obtained polymer may be three-dimensionally crosslinked. As for the glass transition temperature of the polymer encapsulated in the microgel, in the case of a homopolymer, a value described in *POLYMER HANDBOOK 4th Edition* (WILEY INTERSCIENCE) is used, and in the case of a copolymer, the glass transition temperature is estimated using the Fox equation described in L. A. Wood et al., *J. Polymer Sci.*, Vol. 28, 319 (1958).

Specific examples of the monomer corresponding to the (A) a polymer having Tg≥50° C. (monomer for the component (A)) for use in the present invention are illustrated below, but the present invention is not limited thereto.

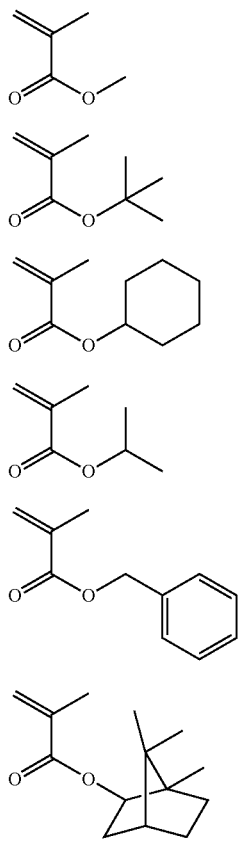

M-1
M-2
M-3
M-4
M-5
M-6

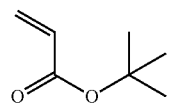

M-7

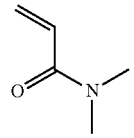

M-8

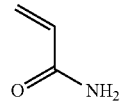

M-9

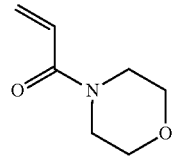

M-10

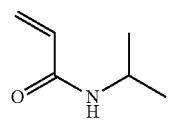

M-11

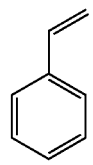

M-12

The content of the polymer having a glass transition temperature of 50° C. or more based on the solid content of the microgel is preferably from 5 to 50 mass %, more preferably from 7 to 30 mass %, and most preferably from 10 to 20 mass %.

(B) Photoinitiator

The photoinitiator (B) for use in the present invention is preferably an acid and/or radical generator and, for example, a known thermal polymerization initiator, a compound having a bond with a small bond dissociation energy, a photopolymerization initiator, and a photoacid generator can be used.

Examples of the photoinitiator for use in the present invention include (a) an organic halide, (b) a carbonyl compound, (c) an azo compound, (d) an organic peroxide, (e) a metallocene compound, (f) an azide compound, (g) a hexaarylbiimidazole compound, (h) an organic borate compound, (i) a disulfone compound, (j) an oxime ester compound, and (k) an onium salt compound.

As the organic halide (a), compounds described in paragraph [0022] to [0023] of JP-A-2008-195018 are preferred.

As the carbonyl compound (b), compounds described in paragraph [0024] of JP-A-2008-195018 are preferred.

As the azo compound (c), for example, azo compounds described in JP-A-8-108621 may be used.

As the organic peroxide (d), for example, compounds described in paragraph [0025] of JP-A-2008-195018 are preferred.

As the metallocene compound (e), for example, compounds described in paragraph [0026] of JP-A-2008-195018 are preferred.

The azide compound (f) include compounds such as 2,6-bis(4-azidobenzylidene)-4-methylcyclohexanone.

As the hexaarylbiimidazole compound (g), for example, compounds described in paragraph [0027] of JP-A-2008-195018 are preferred.

As the organic borate compound (h), for example, compounds described in paragraph [0028] of JP-A-2008-195018 are preferred.

The disulfone compound (i) includes compounds described in JP-A-61-166544.

As the oxime ester compound (j), for example, compounds described in paragraphs [0028] to [0030] of JP-A-2008-195018 are preferred.

Examples of the onium salt compound (k) include onium salts such as diazonium salts described in S. I. Schlesinger, Photogr. Sci. Eng., 18, 387 (1974), T. S. Bal et al., Polymer, 21, 423 (1980), and JP-A-5-158230 (corresponding to diazonium of NI3), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Patent Application Publication No. 2008/0311520, JP-A-2-150848, JP-A-2008-195018, and J. V. Crivello et al., Macromolecules, 10(6), 1307 (1977), sulfonium salts described in European Patents 370,693, 233, 567, 297,443 and 297,442, U.S. Pat. Nos. 4,933,377, 4,760,013, 4,734,444 and 2,833,827, and German Patents 2,904,626, 3,604,580 and 3,604,581, selenonium salts described in J. V. Crivello et al., J. Polymer Sci., Polymer Chem. Ed., 17, 1047 (1979), arsonium salts described in C. S. Wen et al., Teh, Proc. Conf. Rad. Curing ASIA, page 478, Tokyo, October (1988), and azinium salts described in JP-A-2008-195018.

Among these, an onium salt capable of generating an acid or a radical is preferred, an iodonium salt and a sulfonium salt are more preferred, and an onium salt having, in the molecule, a hydroxy group, an amino group, an isocyanate group or a terminal ethylenically unsaturated bonding group is most preferred. When a hydroxy group, an amino group or an isocyanate group is contained in the molecule, such a group reacts with the wall material at the synthesis of the microgel, so that elution of the photoinitiator during preparation of the photosensitive solution or after coating the solution can be prevented. When a terminal ethylenically unsaturated bonding group is contained, this group reacts with the monomer for the component (A), whereby elution can be prevented similarly.

Specific examples of the photoinitiator encapsulated in the microgel for use in the present invention are illustrated below, but the present invention is not limited thereto.

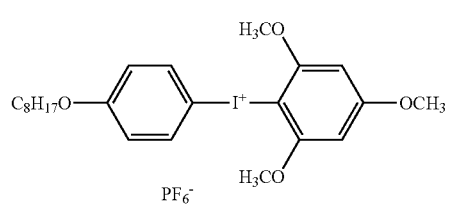

I-1

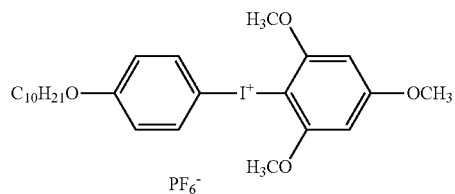

I-2

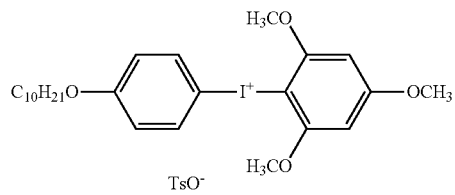

I-3

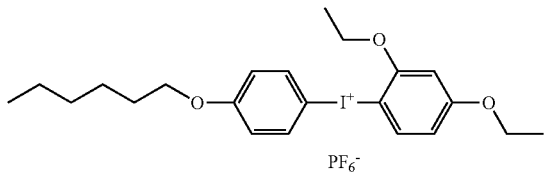

I-4

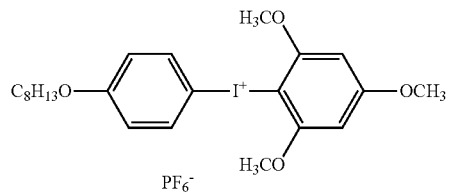

I-5

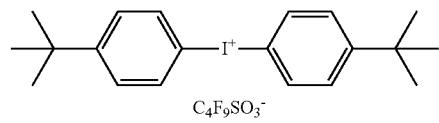

I-6

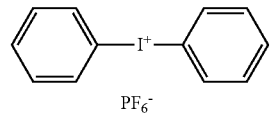

I-7

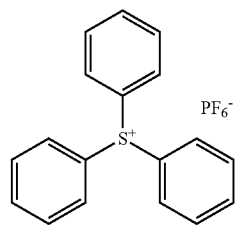

S-1

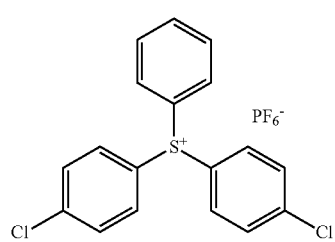

S-2

-continued
S-3
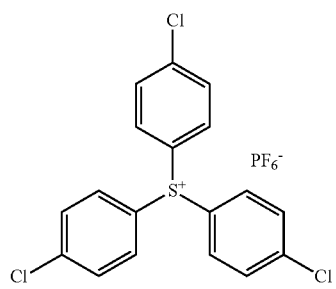
S-4
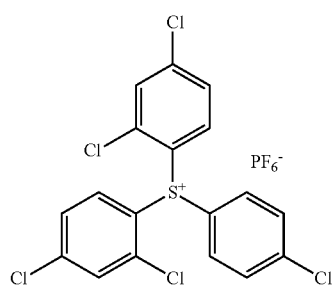
S-5
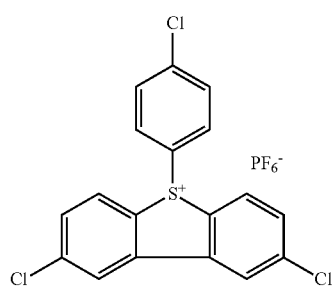
S-6
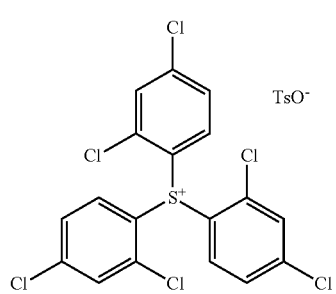
S-7
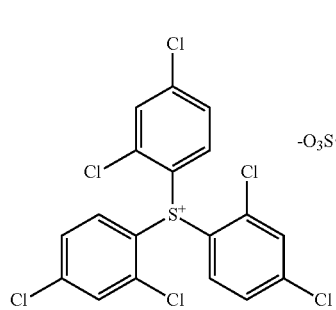
-continued
S-8
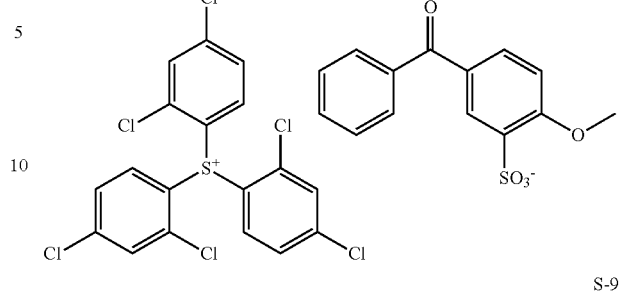
S-9
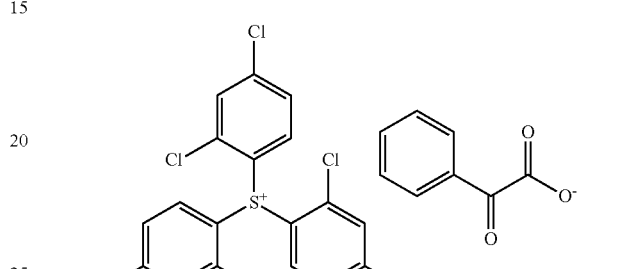
S-10
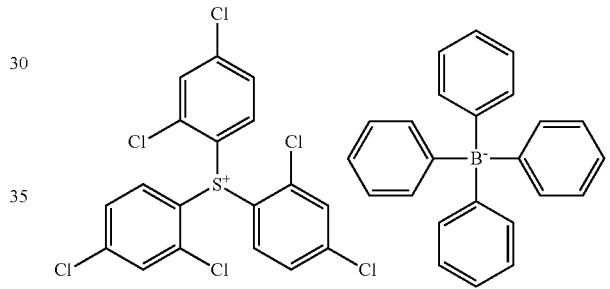
S-11
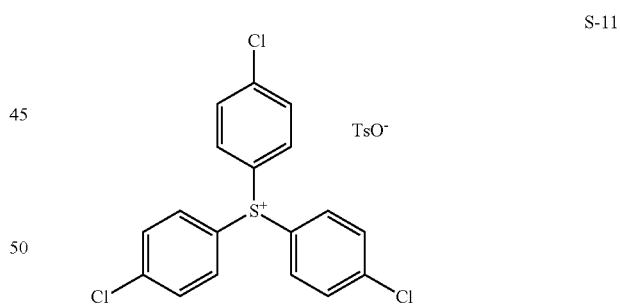
S-12
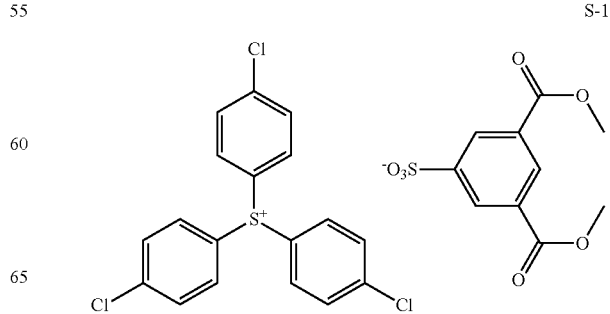

S-13
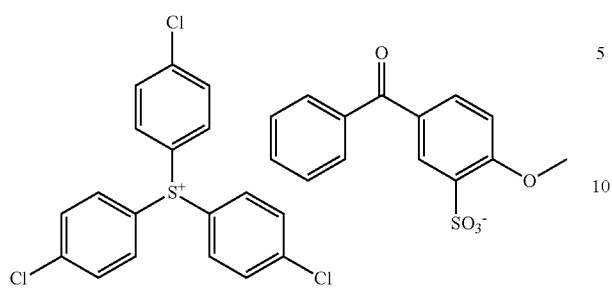
S-14
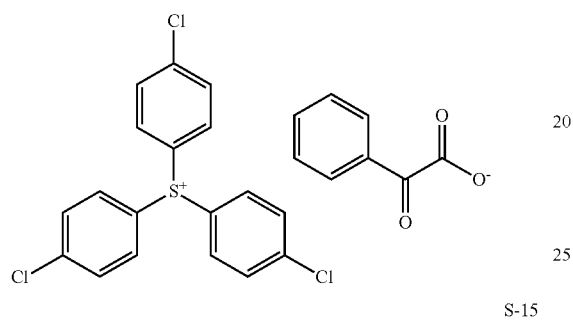
S-15
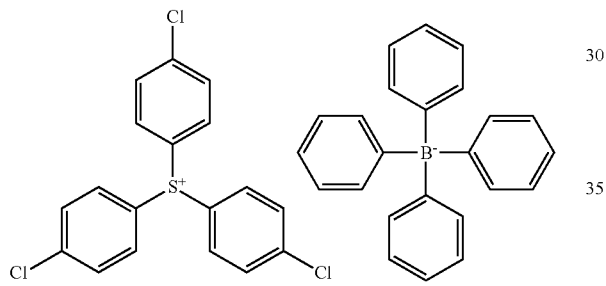
S-16
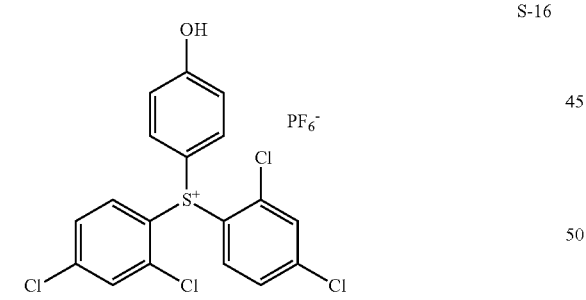
S-17
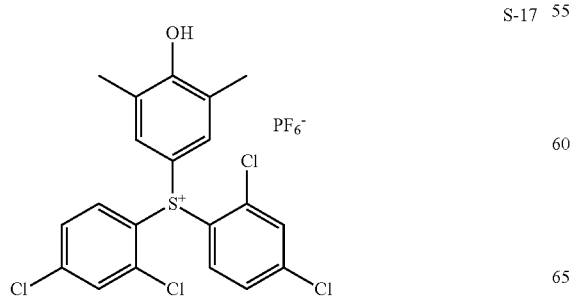
S-18
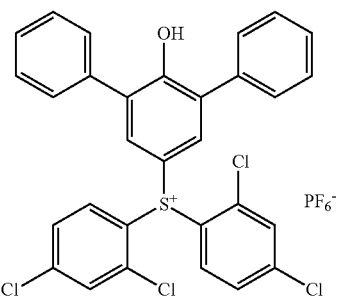
S-19
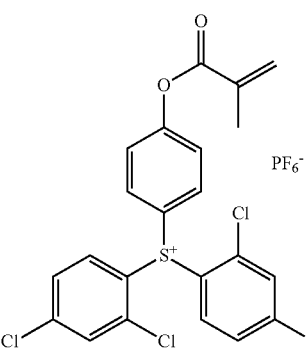
S-20
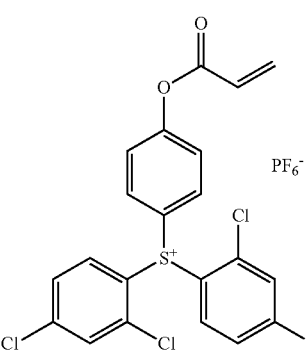
S-21
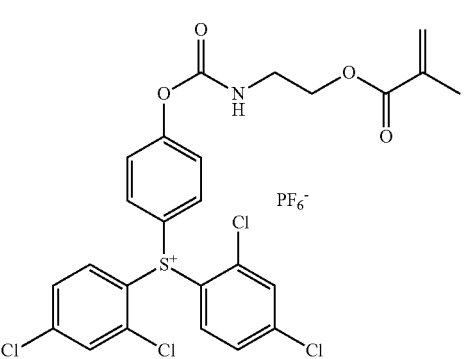

-continued

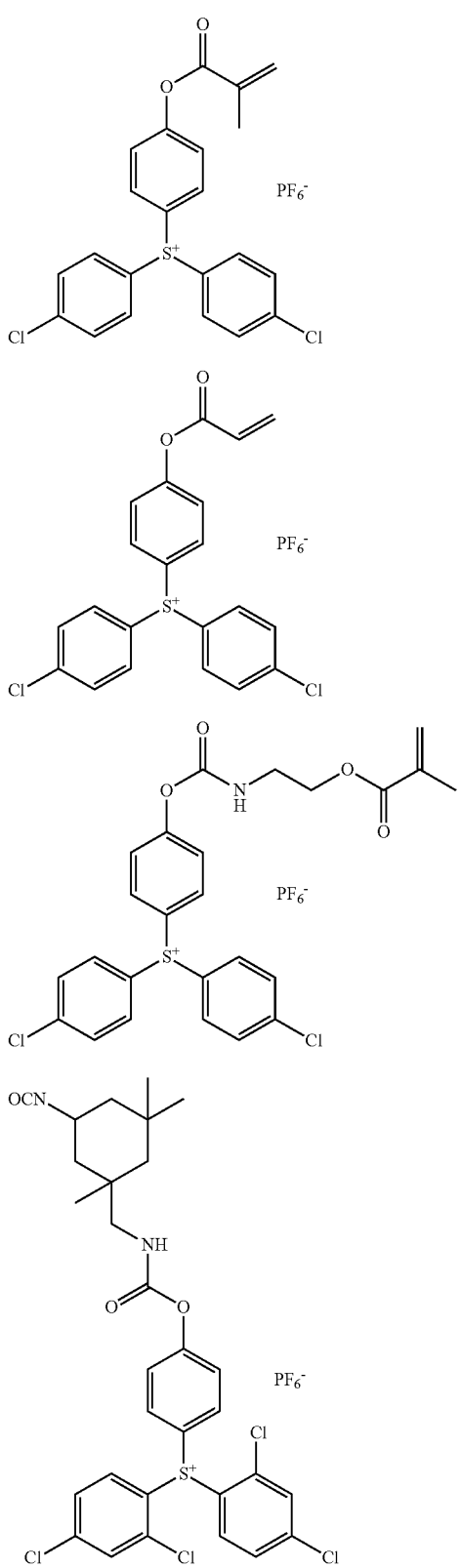

S-22

S-23

S-24

S-25

The content of the photoinitiator based on the solid content of the microgel is preferably from 5 to 50 mass %, more preferably from 7 to 30 mass %, and most preferably from 10 to 20 mass %.

Within the range above, good sensitivity and good resistance to staining of the non-image area at printing can be obtained.

(C) Infrared Absorbing Dye

The infrared absorbing dye has a function of converting the absorbed infrared ray into heat and a function of being excited by the infrared ray to cause electron transfer and/or energy transfer to the photoinitiator (B).

As the dye, commercially available dyes and known dyes described, for example, in literatures such as "Dye Handbook" (compiled by the Society of Synthetic Organic Chemistry, Japan, published in 1970) can be utilized. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt and metal thiolate complex.

Among these dyes, a cyanine dye, a squarylium dye, a pyrylium salts, a nickel thiolate complex and an indolenine cyanine dye are preferred, and a cyanine dye and an indolenine cyanine dye are more preferred. Above all, the dye is preferably, for example, a cyanine dye represented by the following formula (a):

Formula (a):

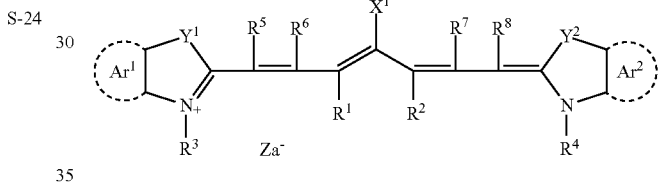

In formula (a), $X^1$ represents a hydrogen atom, a halogen atom, $-N(R^9)(R^{10})$, $-X^2-L^1$, or a group shown below, wherein $R^9$ and $R^{10}$, which may be the same as or different from each other, represent an aryl group having a carbon atom number of 6 to 10, which may have a substituent, an alkyl group having a carbon atom number of 1 to 8, or a hydrogen atom, and $R^9$ and $R^{10}$ may combine with each other to form a ring. Among others, a phenyl group is preferred ($-NPh_2$). $X^2$ represents an oxygen atom or a sulfur atom, $L^1$ represents a hydrocarbon group having a carbon atom number of 1 to 12, a heteroaryl group or a heteroatom-containing hydrocarbon group having a carbon atom number of 1 to 12. Incidentally, the heteroatom as used herein indicates N, S, O, a halogen atom or Se. In the group shown below, $Xa^-$ is defined in the same manner as $Za^-$ described later, and $R^a$ represents a substituent selected from a hydrogen atom, an alkyl group, an aryl group, a substituted or unsubstituted amino group, and a halogen atom.

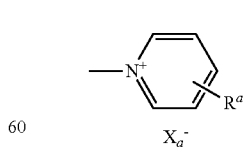

Each of $R^1$ and $R^2$ independently represent a hydrocarbon group having a carbon atom number of 1 to 12. In view of storage stability of the coating solution for the recording layer, $R^1$ and $R^2$ are preferably a hydrocarbon group having a carbon atom number of 2 or more. Also, $R^1$ and $R^2$ may combine with each other to form a ring, and when forming a ring, the ring formed is preferably a 5-membered ring or a 6-membered ring.

$Ar^1$ and $Ar^2$ may be the same as or different from each other and represent an aryl group which may have a substituent. Preferred aryl groups include a benzene ring and a naphthalene ring. Also, preferred substituents include a hydrocarbon group having a carbon atom number of 12 or less, a halogen atom, and an alkoxy group having a carbon atom number of 12 or less. $Y^1$ and $Y^2$ may be the same as or different from each other and represent a sulfur atom or a dialkylmethylene group having a carbon atom number of 12 or less. $R^3$ and $R^4$ may be the same as or different from each other and represent a hydrocarbon group having a carbon atom number of 20 or less, which may have a substituent. Preferred substituents include an alkoxy group having a carbon atom number of 12 or less, a carboxy group, and a sulfo group. $R^5$, $R^6$, $R^7$ and $R^8$ may be the same as or different from each other and represent a hydrogen atom or a hydrocarbon group having a carbon atom number of 12 or less. In view of availability of the raw material, a hydrogen atom is preferred. $Za^-$ represents a counter anion, provided that when the cyanine dye represented by formula (a) has an anionic substituent in its structure and neutralization of the electric charge is not necessary, $Za^-$ is unneeded. In view of storage stability of the coating solution for the image-recording layer, $Za^-$ is preferably a halide ion, a perchlorate ion, a tetrafluoroborate ion, a hexafluorophosphate ion or a sulfonate ion, more preferably a perchlorate ion, a hexafluorophosphate ion or an arylsulfonate ion.

Specific examples of the cyanine dye represented by formula (a), which can be suitably used, include compounds described in paragraph [0017] to [0019] of JP-A-2001-133969, and compounds described in paragraphs [0016] to [0021] of JP-A-2002-023360 and paragraphs [0012] to [0037] of JP-A-2002-040638. Compounds described in paragraphs [0034] to [0041] of JP-A-2002-278057 and compounds described in paragraphs [0080] to [0086] of JP-A-2008-195018 are preferred, and compounds described in paragraphs [0035] to [0043] of JP-A-2007-90850 are most preferred.

Among others, most preferred is a cyanine dye represented by the following formula (1) having a substituent capable of bonding with an isocyanate used as a wall material at the synthesis of the microgel or having a terminal ethylenically unsaturated bonding group capable of bonding with the encapsulated monomer by a radical reaction at the synthesis of the microgel:

Formula (1):

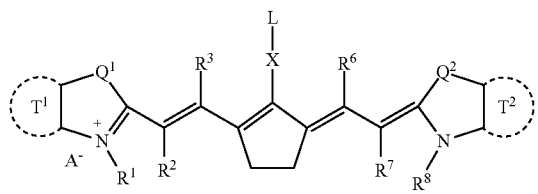

wherein $R^1$ and $R^8$ represent a monovalent substituent group; each of $R^2$, $R^3$, $R^6$ and $R^7$ independently represents a hydrogen atom or a hydrocarbon group; X represents an oxygen atom, a nitrogen atom or a sulfur atom; L represents an aromatic hydrocarbon ring, a heteroaromatic ring or a heteroatom-containing alkyl group having a carbon atom number of 1 to 12, provided that when X is a nitrogen atom, —N($L^1$)($L^2$) results, and $L^1$ and $L^2$ may be the different and represent —$NR^9$—, a sulfur atom, an oxygen atom or a dialkylmethylene group, and $R^9$ represents a hydrogen atom or a hydrocarbon group which may have a substituent; each of $T^1$ and $T^2$ independently represents an aromatic ring or a heteroaromatic ring, and the ring may further have a substituent; $A^-$ represents a counter ion; and in the molecule, at least one of $T^1$, $T^2$, $R^1$, $R^8$ and L has a hydroxy group, an amino group, an isocyanate group, or a terminal ethylenically unsaturated bonding group. When a hydroxy group, an amino group or an isocyanate group is contained in the molecule, such a group reacts with the wall material at the synthesis of the microgel, so that elution of the infrared absorbing dye during preparation of the photosensitive solution or after coating the solution can be prevented. When a terminal ethylenically unsaturated bonding group is contained, this group reacts with the monomer for the component (A), whereby elution can be prevented similarly.

Specific examples of the infrared absorbing dye for use in the present invention, which is encapsulated, are illustrated below, but the present invention is not limited thereto.

IR-1

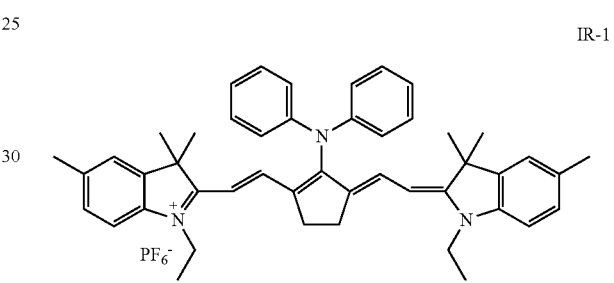

IR-2

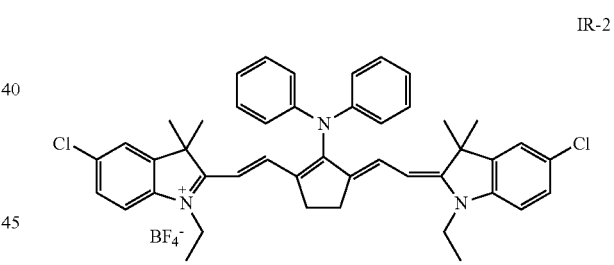

IR-3

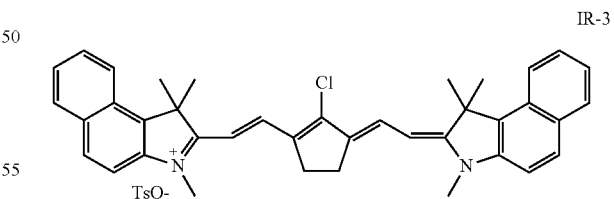

IR-4

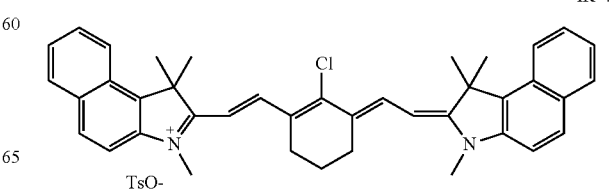

IR-5
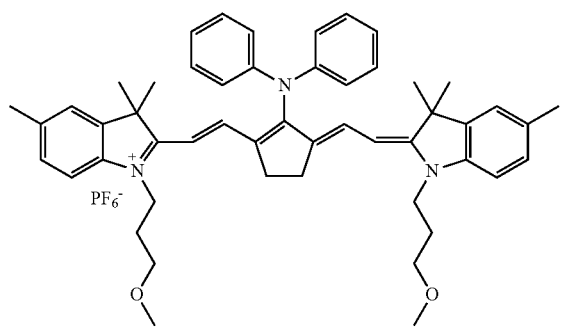
IR-6
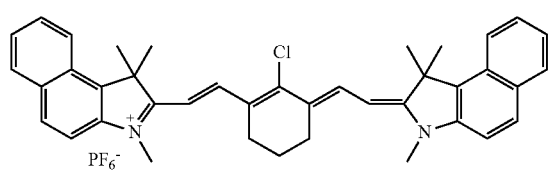
IR-7
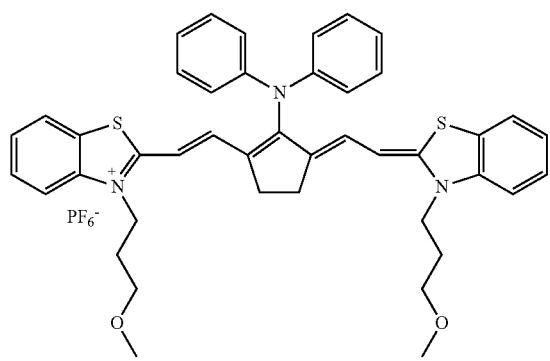
IR-8
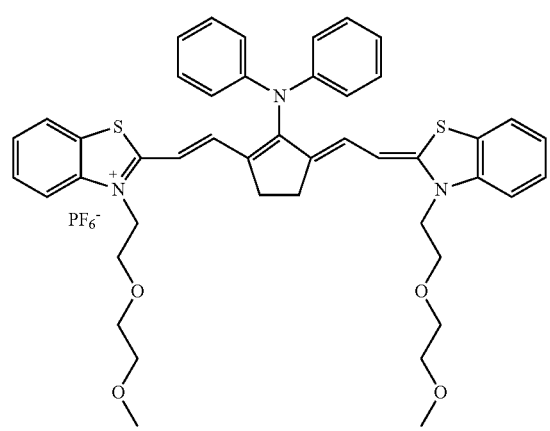
IR-9
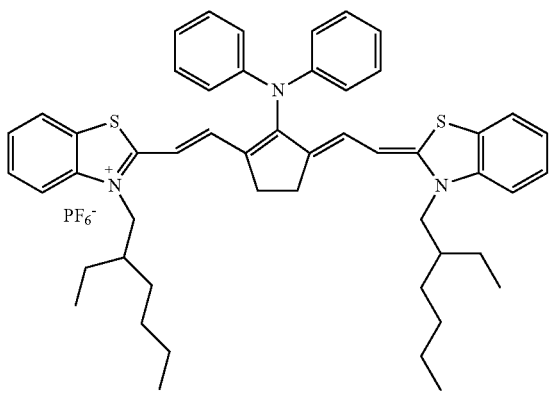
IR-10
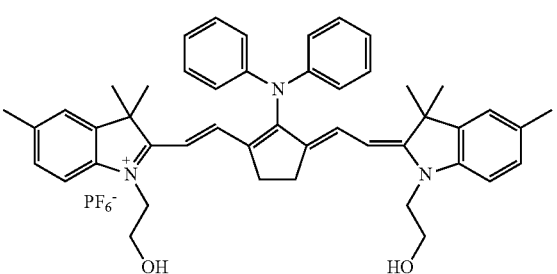
IR-11
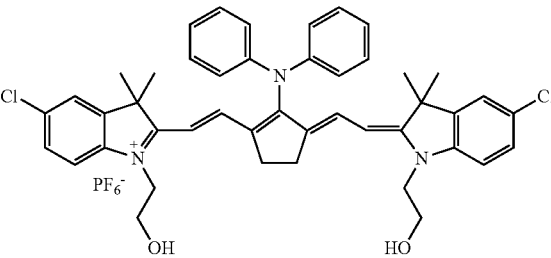
IR-12
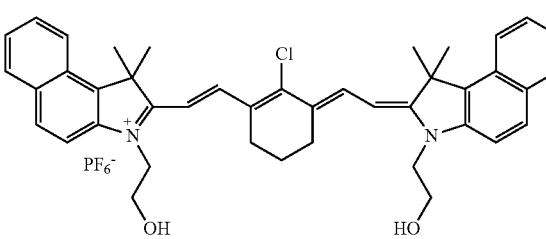
IR-13
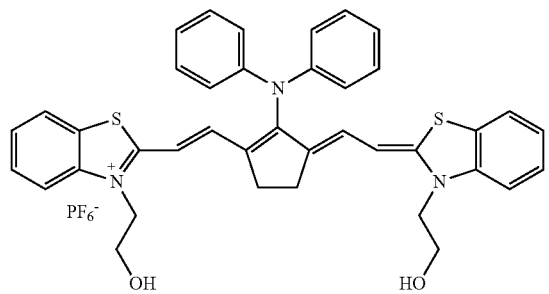

-continued
IR-14
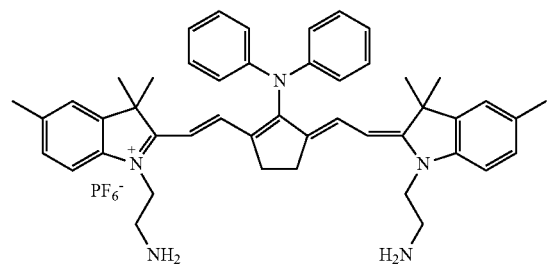
IR-15
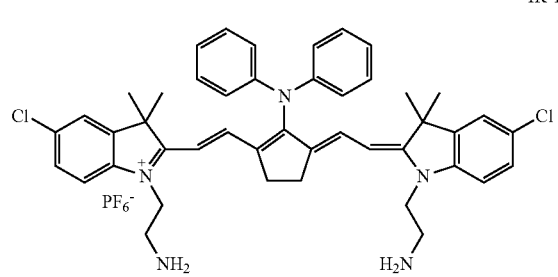
IR-16
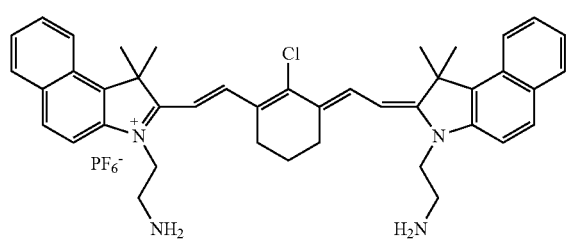
IR-17
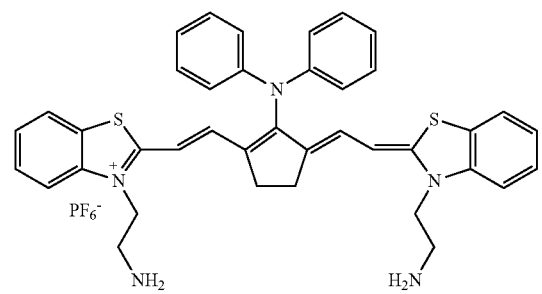
IR-18
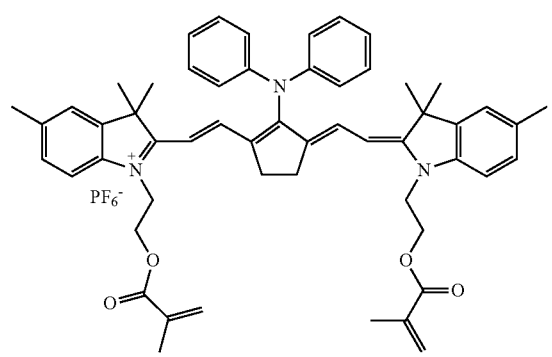
-continued
IR-19
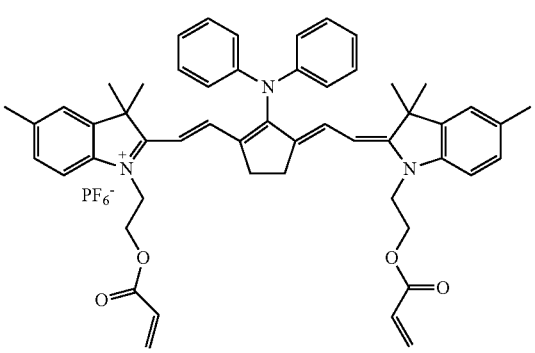
IR-20
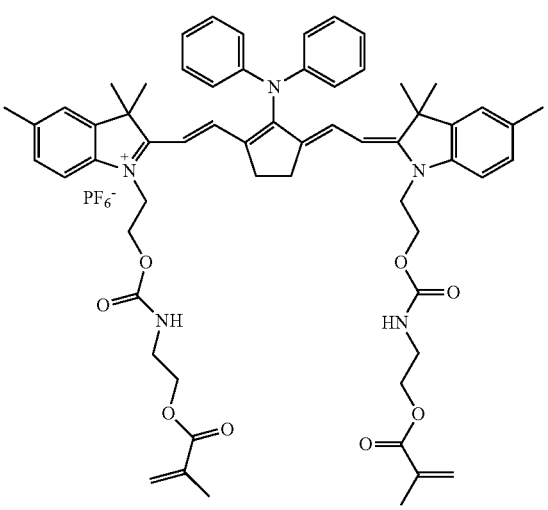
IR-21
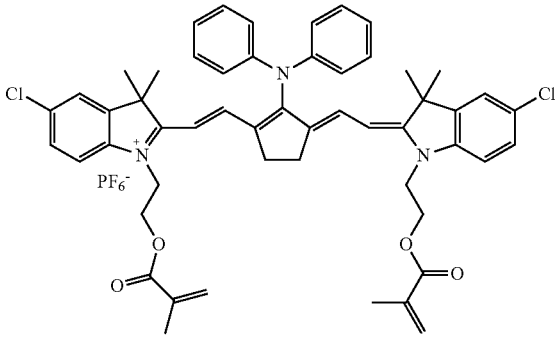
IR-22
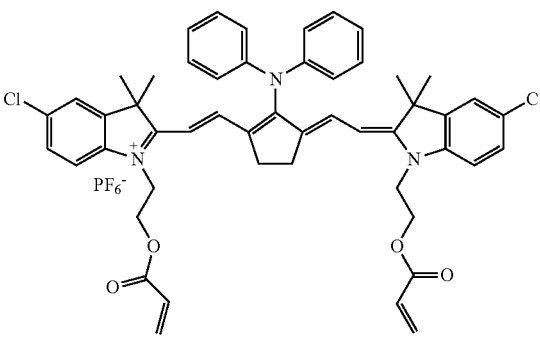

IR-23
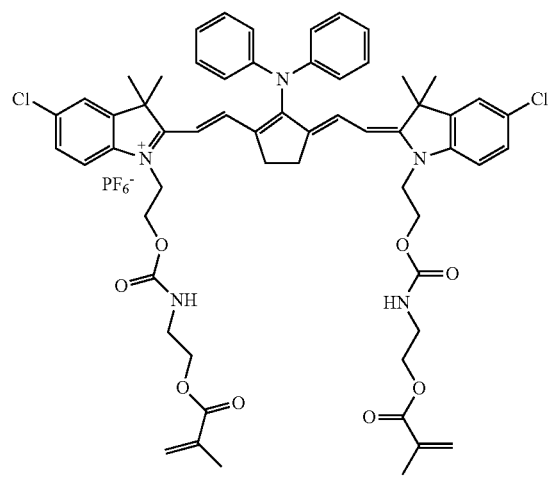
IR-24
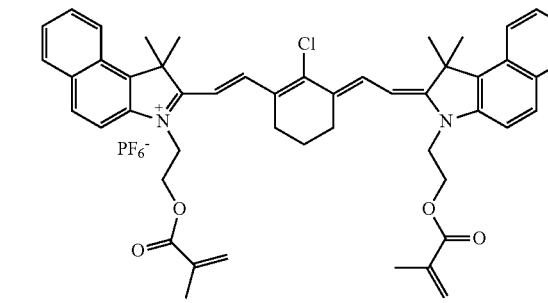
IR-25
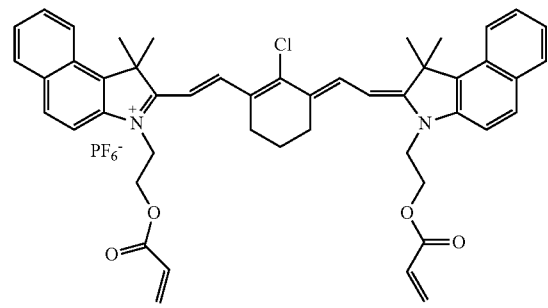
IR-26
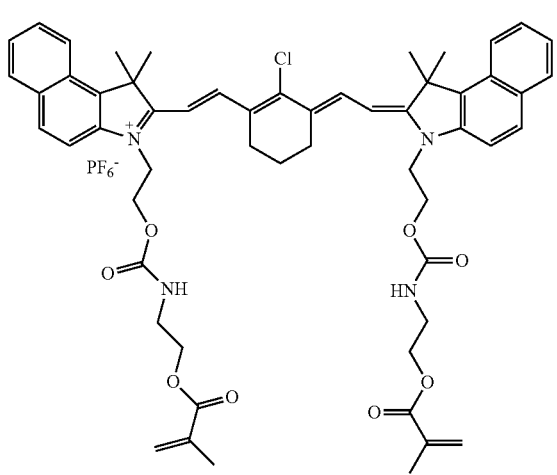
IR-27
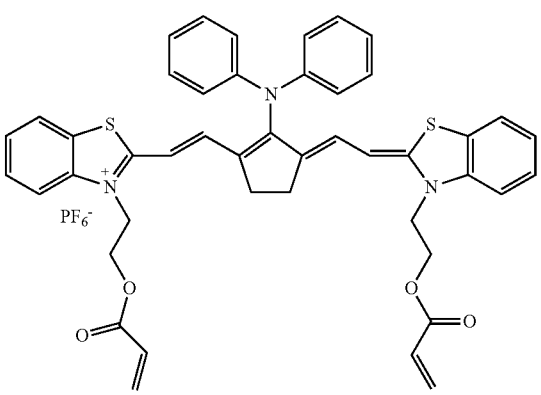
IR-28
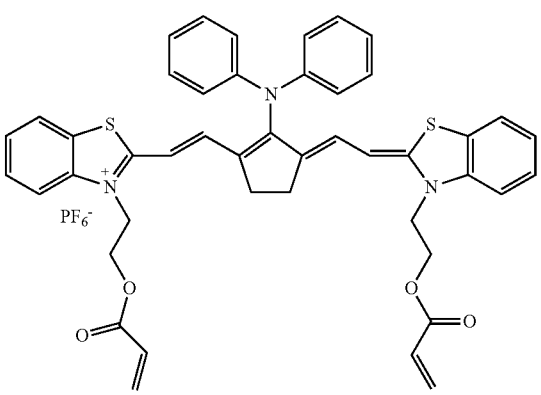
IR-29
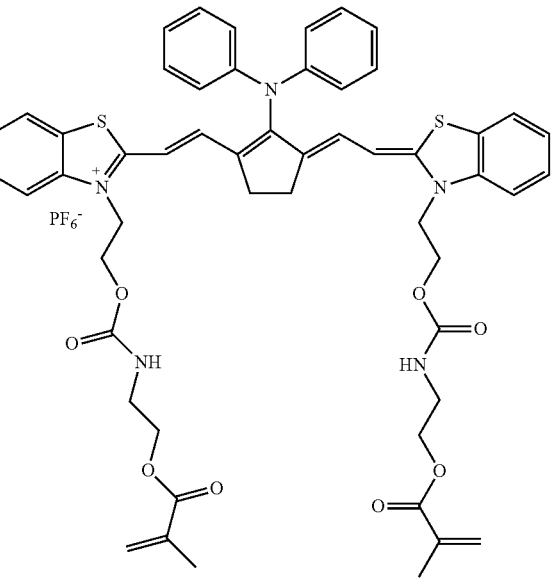

IR-30

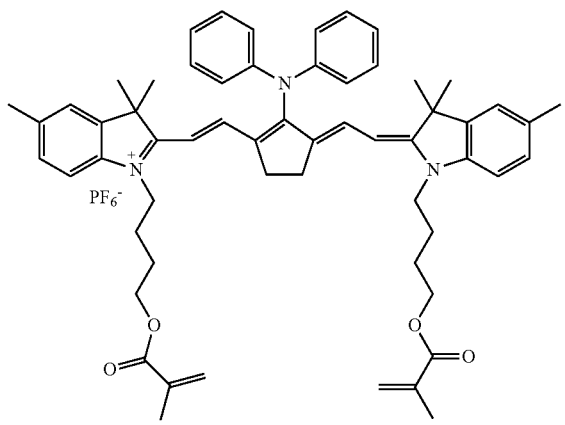

As for the infrared absorbing dye (C), only one dye may be used, or two or more dyes may be used in combination. Also, an infrared absorber other than the infrared absorbing dye such as pigment may be used in combination. Preferred pigments are compounds described in paragraphs [0072] to [0076] of JP-A-2008-195018.

The content of the infrared absorbing dye for use in the present invention based on the solid content of the microgel is preferably from 1 to 30 mass %, more preferably from 1 to 20 mass %, and most preferably from 3 to 10 mass %.

(D) Acid Color Former

The microgel for use in the present invention preferably further contains (D) an acid color former.

As the acid color former (D), a conventionally known compound can be used without limitation as long as the compound interacts with the acid generated from the compound capable of generating an acid by light or heat and causes color change. Above all, a spiropyran compound and a spirooxazine compound are preferred. The spiropyran compound is a compound having a basic structure where a pyran ring and another ring (aliphatic ring or heterocyclic ring) are spiro-bonded. The spirooxazine compound is a compound having a basic structure where an oxazine ring and another ring (aliphatic ring or heterocyclic ring) are spiro-bonded. Another ring (aromatic ring, aliphatic ring or heterocyclic ring) may be further fused to the pyrane ring, the oxazine ring, or the ring spiro-bonded thereto. The pyrane ring, the oxazine ring, the ring spiro-bonded thereto, and a condensed ring thereof may have a substituent. The position of the spiro bond in the pyrane ring is the 2-position (2H-pyrane ring) or the 4-position (4H-pyrane ring). The 2-position is more preferred than the 4-position. The position of the Spiro bond in the oxazine ring is the 2-position (2H-oxazine ring). As the ring spiro-bonded to the pyrane ring or oxazine ring, a heterocyclic ring is more preferred than an aliphatic ring. Also, in view of stability, a spirooxazine compound is more preferred than a spiropyran compound.

Specific examples of the spiropyran- and spirooxazine-based compounds include compounds described in JP-A-5-206489, JP-A-6-199827, JP-A-5-72668, JP-A-6-95291, JP-A-6-199827, JP-A-7-17978, JP-A-8-290667, JP-A-7-138251, JP-A-7-258245, JP-A-7-300484, JP-A-8-245627, JP-A-8-291176, JP-A-9-241626, JP-A-9-323990, JP-T-11-503117 (the term "JP-T" as used herein means a published Japanese translation of a PCT patent application), JP-A-2000-281920, JP-A-2002-332480, JP-T-2003-535095, JP-A-2006-96027. In addition, compounds described in Chapter 1: Spiropyran Leuco Dyes of [Chemistry and Applications of Leuco Dyes] (compiled by Ramaiah Muthyala, issued by Plenum Press, 1997th), compounds described in Chapter 10: Thermochromism of Organic Compounds of [Organic Photochromic and Thermochromic Compounds, Volume 2: Physicochemical Studies, Biological Applications, and Thermochromism] (compiled by John C. Crano and Robert J. Guglielmetti, issued by Kluwer Academic/Plenum Publishers, 1999), and compounds described in Chapter 10: Thermochromism of Organic Compounds of [Chemistry and Applications of Leuco Dyes] (compiled by Ramaiah Muthyala, issued by Plenum Press, 1997) can be also used.

As the acid color former, those having a hydroxy group, an amino group, an isocyanate group or a terminal ethylenically unsaturated bonding group in the molecule are more preferred. When a hydroxy group, an amino group or an isocyanate group is contained in the molecule, such a group reacts with the wall material at the synthesis of the microgel, so that elution of the acid color former during preparation of the photosensitive solution or after coating the solution can be prevented. When a terminal ethylenically unsaturated bonding group is contained, this group reacts with the monomer for the component (A), whereby elution can be prevented similarly.

Specific examples of the acid color former for use in the present invention, which is encapsulated, are illustrated below, but the present invention is not limited thereto.

SP-1

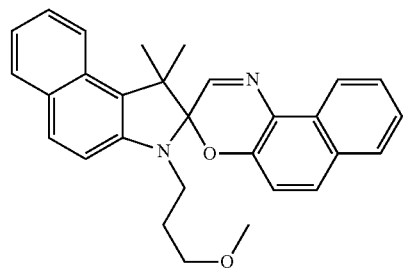

SP-2

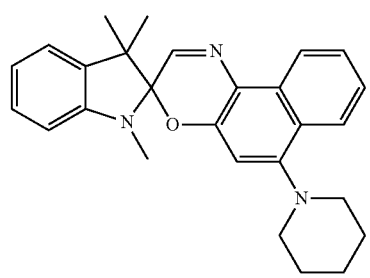

SP-3

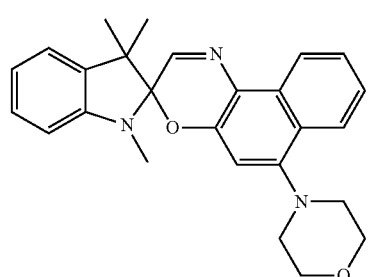

-continued
SP-4
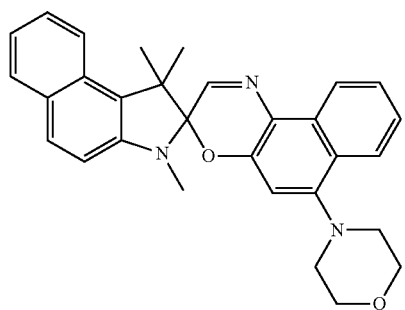
SP-5
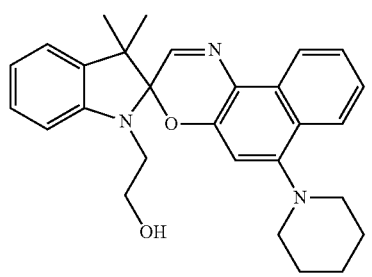
SP-6
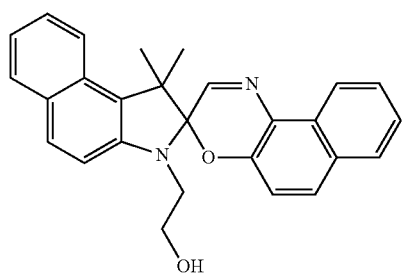
SP-7
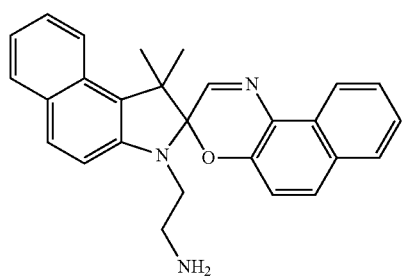
SP-8
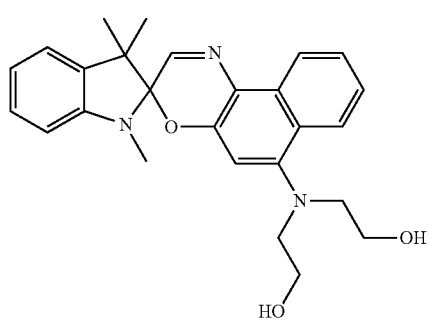
-continued
SP-9
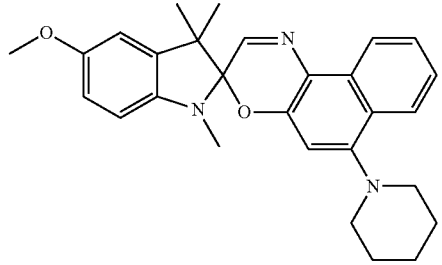
SP-10
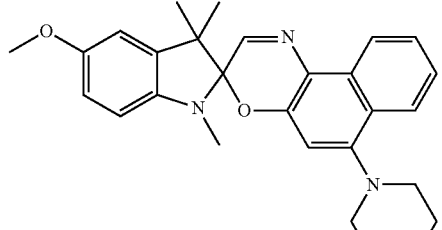
SP-11
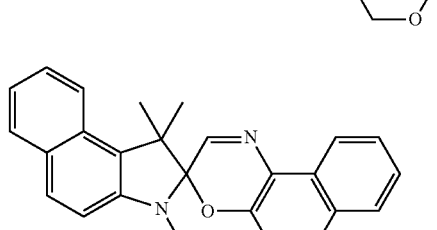
SP-12
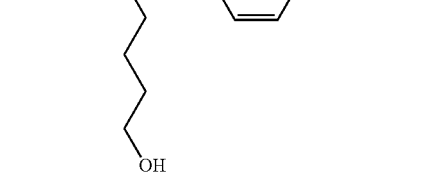
SP-13
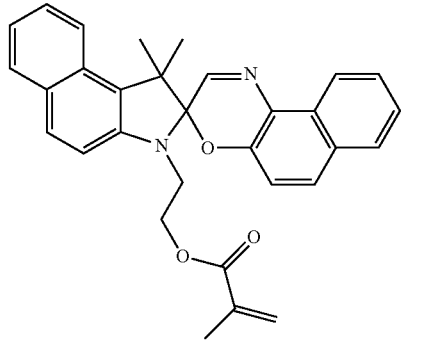

SP-14
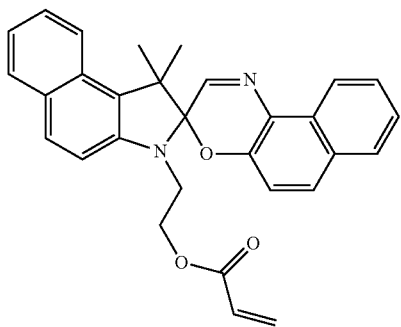
SP-15
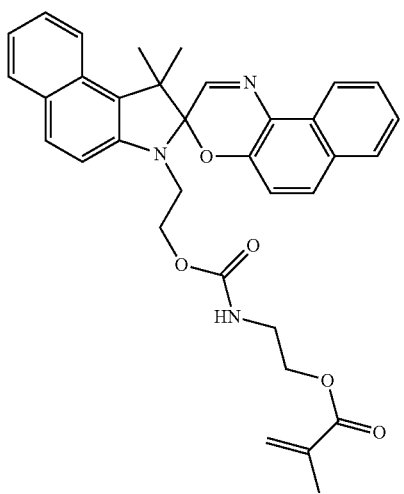
SP-16
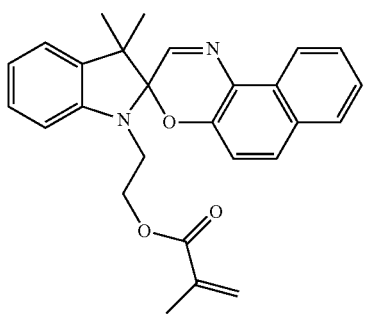
SP-17
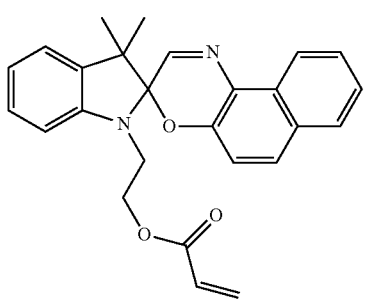
SP-18
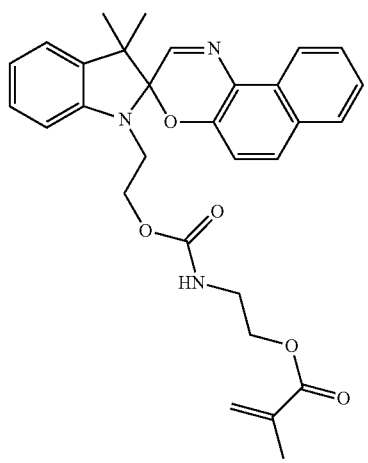
SP-19
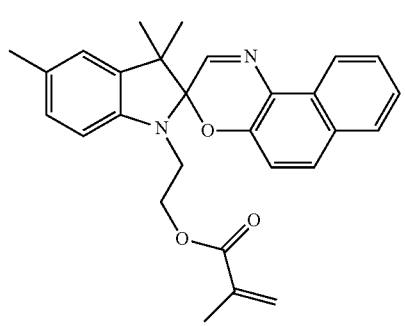
SP-20
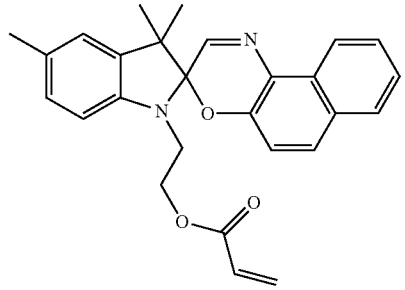
SP-21
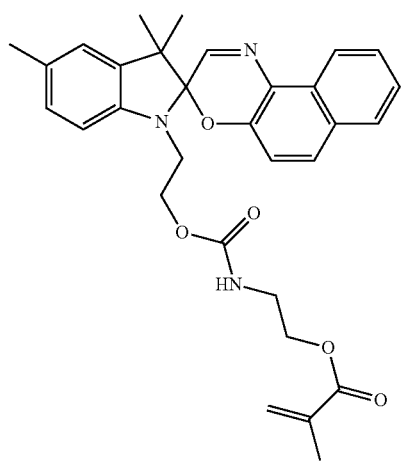

-continued
SP-22
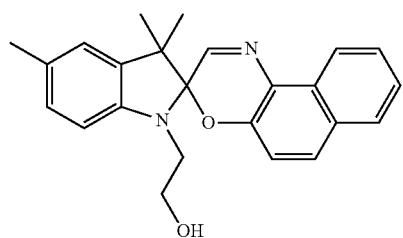
SP-23
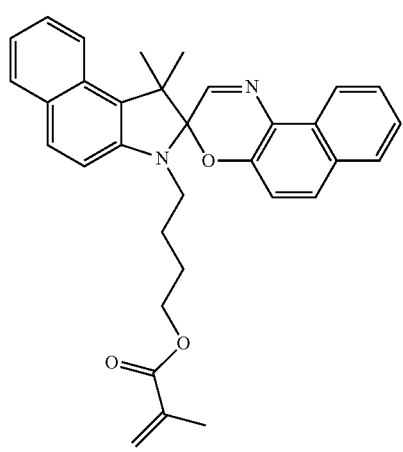
SP-24
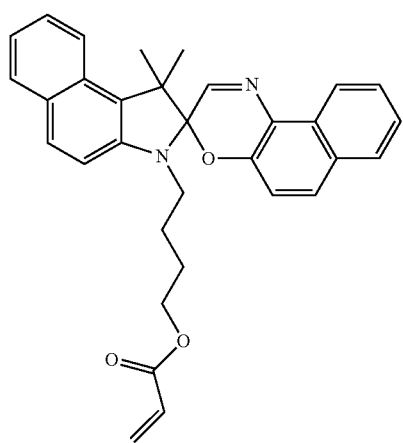
-continued
SP-25
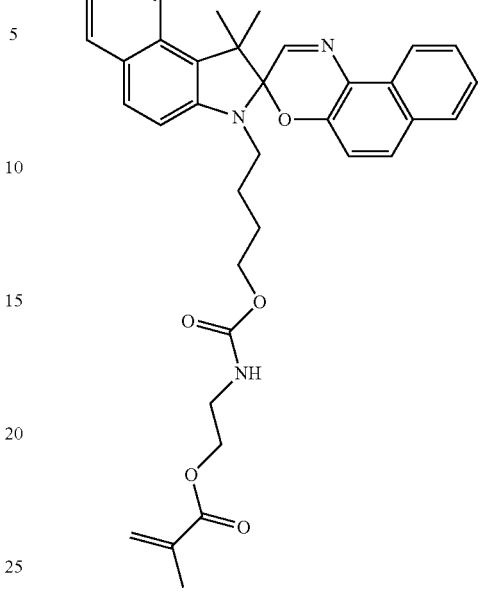
SP-26
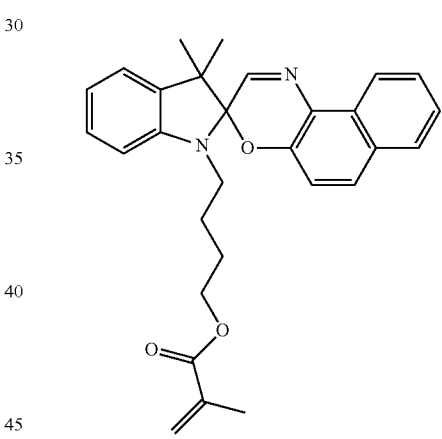
SP-27
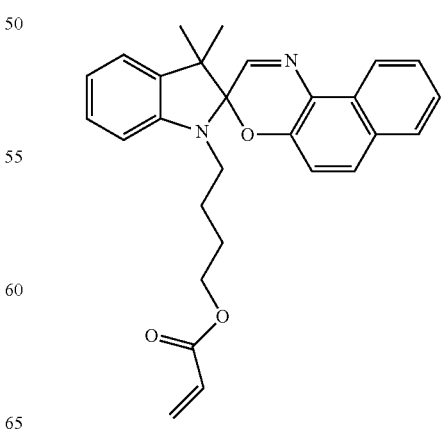

SP-28
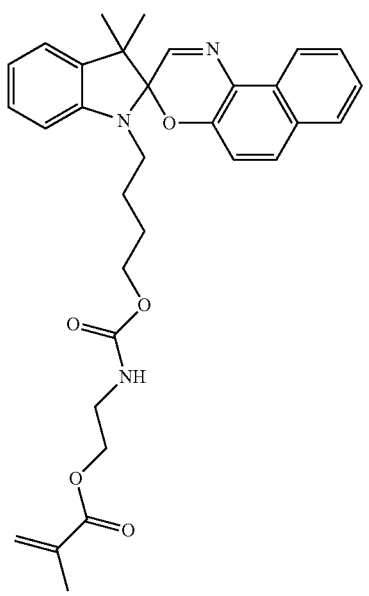
SP-31
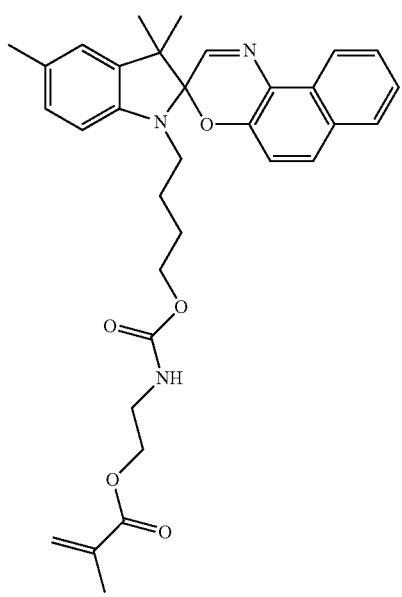
SP-29
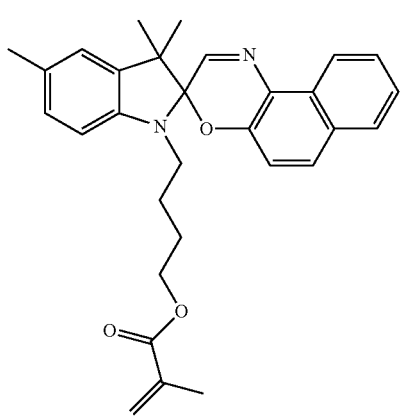
SP-32
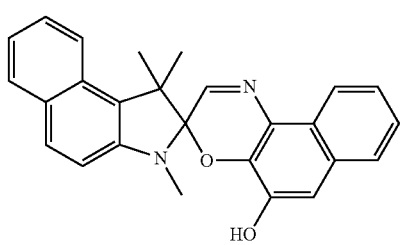
SP-33
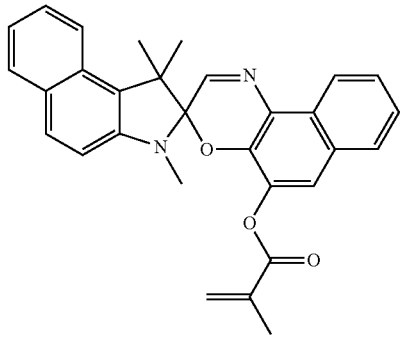
SP-30
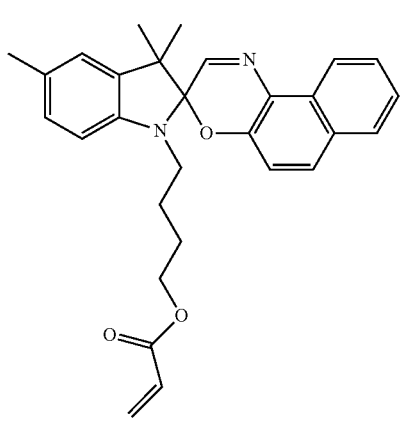
SP-34
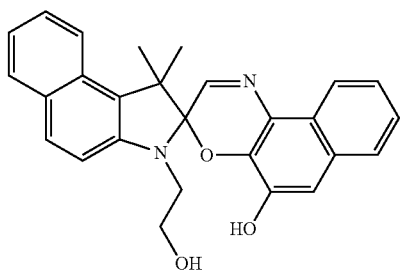

-continued

SP-35

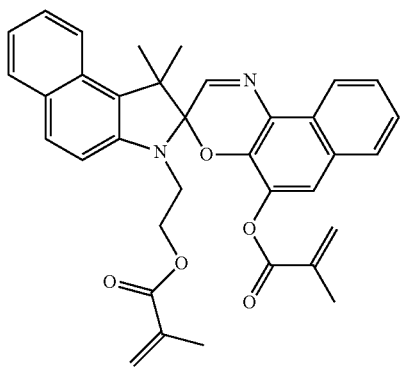

SP-36

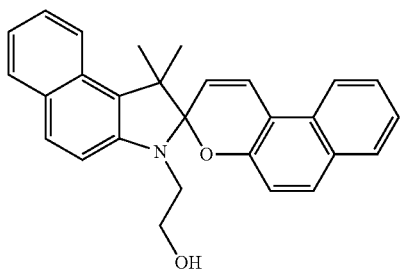

SP-37

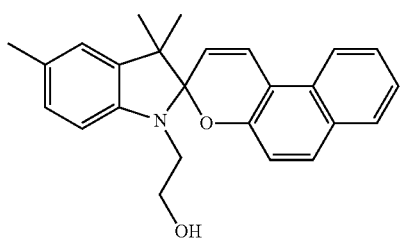

SP-38

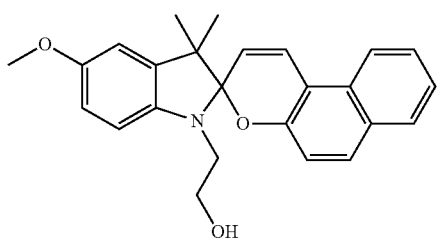

SP-39

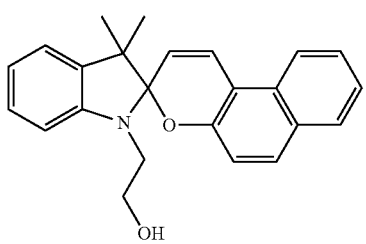

-continued

SP-40

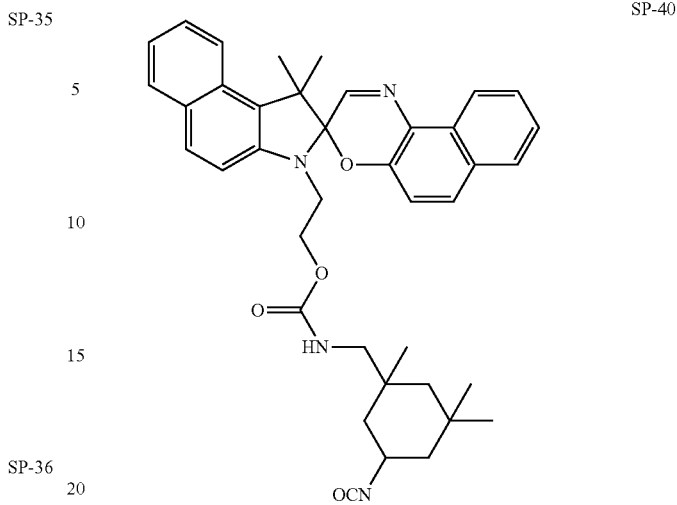

The content of the acid color former based on the solid content of the microgel is preferably from 5 to 50 mass %, more preferably from 7 to 30 mass %, and most preferably from 10 to 20 mass %.

[Binder Polymer]

As the binder polymer, either one of a water-soluble polymer and a water-insoluble polymer may be appropriately selected and used. Specific examples thereof include a polyvinyl alcohol, a modified polyvinyl alcohol, a polyvinylpyrrolidone, a water-soluble cellulose derivative, and a poly(meth)acrylonitrile.

Also, in the case of applying the coloring photosensitive composition to the image-recording layer of a lithographic printing plate precursor, a binder polymer having a crosslinking functional group in the main or side chain, preferably in the side chain, described in JP-A-2008-195018 is preferred, because the film strength of the image area is enhanced. Thanks to the crosslinking group, crosslinking is formed between polymers and curing is accelerated.

The crosslinking functional group is preferably, for example, an ethylenically unsaturated group such as (meth)acryl group, vinyl group, allyl group and styryl group, or an epoxy group, and such a group can be introduced into the polymer by a polymer reaction or copolymerization. For example, a reaction of an acyl polymer or polyurethane having a carboxy group in the side chain with a glycidyl methacrylate, or a reaction of a polymer having an epoxy group with an ethylenically unsaturated group-containing carboxylic acid such as methacrylic acid, can be utilized.

The content of the crosslinking group in the binder polymer is preferably from 0.1 to 10.0 mmol, more preferably from 1.0 to 7.0 mmol, and most preferably from 2.0 to 5.5 mmol, per g of the binder polymer.

In the case of application to the image recording layer of a lithographic printing plate precursor, the binder polymer preferably further has a hydrophilic group. The hydrophilic group contributes to imparting on-press developability to the image-recording layer. In particular, thanks to the co-presence of a crosslinking group and a hydrophilic group, both the press life and the developability can be satisfied.

Examples of the hydrophilic group include a hydroxy group, a carboxy group, an alkylene oxide structure, an amino group, an ammonium group, an amide group, a sulfo group, and a phosphoric acid group. Among these, an alkylene oxide structure containing from 1 to 9 alkylene oxide units each having a carbon number of 2 or 3 is preferred. In order to impart a hydrophilic group to the binder polymer, this can be attained by copolymerizing a monomer having a hydrophilic group.

Furthermore, in the case of application to the image-recording layer of a lithographic printing plate precursor, an ink-receptive group such as alkyl group, aryl group, aralkyl group and alkenyl group can be introduced into the binder polymer for use in the present invention. Specifically, this may be attained by copolymerizing a monomer containing an ink-receptive group such as methacrylic acid alkyl ester.

Specific examples (1) to (11) of the binder polymer for use in the present invention is illustrated below, but the present invention is not limited thereto. Here, the ratio of repeating units is a molar ratio.

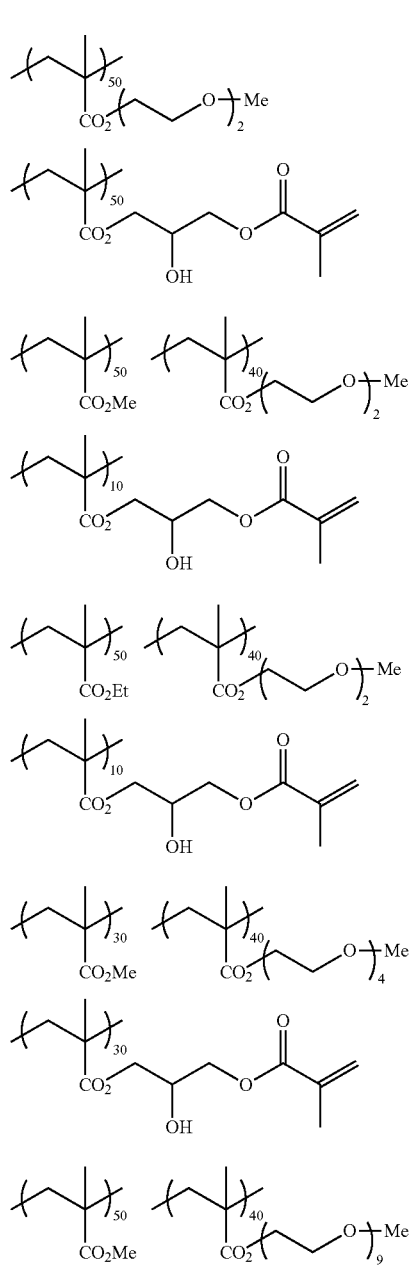

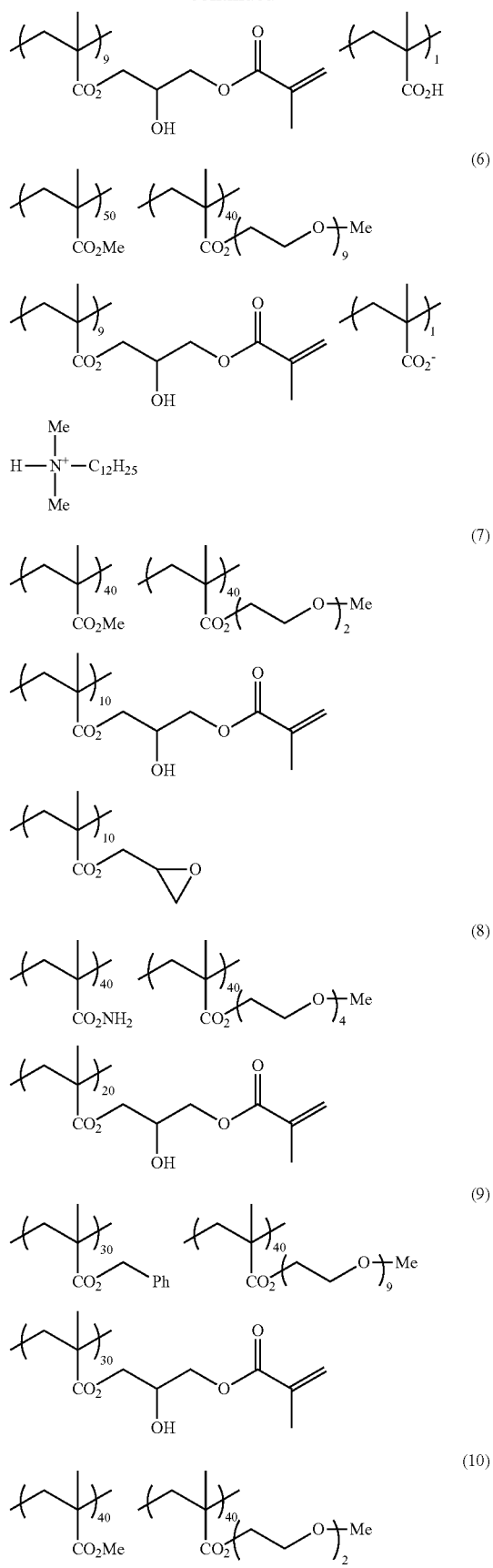

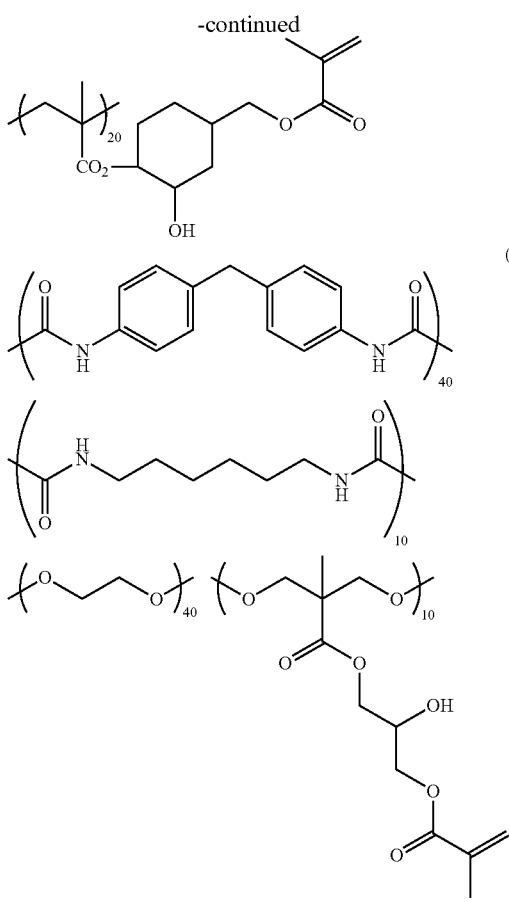

The mass average molar mass (Mw) of the binder polymer for use in the present invention is preferably 2,000 or more, more preferably 5,000 or more, still more preferably from 10,000 to 300,000.

In the present invention, if desired, a hydrophilic polymer such as polyacrylic acid and polyvinyl alcohol described in JP-A-2008-195018 may be used. Also, an ink-receptive binder polymer and a hydrophilic binder polymer may be used in combination.

The content of the binder polymer is usually from 5 to 90 mass %, preferably from 5 to 80 mass %, more preferably from 10 to 70 mass %, based on the entire solid content of the photosensitive composition.

(Application of Coloring Photosensitive Composition)

The coloring photosensitive composition may contain additives other than those described above, according to the purpose. A solution obtained by dissolving or dispersing such a composition in an appropriate solvent is coated on a support or the like and dried to form a coloring photosensitive composition film, whereby an image forming material is produced. The image forming material includes an image forming material utilizing coloring and polymerization/curing by imagewise exposure to an infrared ray, such as lithographic printing plate precursor, printed circuit board, color filter and photomask. Above all, the composition is preferably applied to the production of a lithographic printing plate precursor. As for the infrared ray used, an infrared laser is preferred.

A lithographic printing plate precursor, particularly, a lithographic printing plate precursor of an on-press development type, using the above-described coloring photosensitive composition is described in detail below.

[Lithographic Printing Plate Precursor]

The lithographic printing plate precursor of the present invention is characterized by comprising, in order, a support and an image-recording layer containing the above-described coloring photosensitive composition. The lithographic printing plate precursor of the present invention may have a protective layer on the image-recording layer or may have an undercoat layer between the support and the image-recording layer. The printing plate precursor may further have other layers, if desired.

[Image-Recording Layer]

The image-recording layer for use in the present invention contains the above-described coloring photosensitive composition. In addition, the image-recording layer contains, outside the microgel, a photoinitiator, an infrared absorbing dye, and a polymerizable compound. Furthermore, the layer may contain various additives, if desired.

The photoinitiator and infrared absorbing dye contained outside the microgel may be the same as or different from those within the particle and are selected from the compounds described above regarding the coloring photosensitive composition.

The components in the image-recording layer, except for the coloring photosensitive composition above, the method for forming the image-recording layer, and the like are described below.

(E) Polymerizable Compound

The polymerizable compound for use in the present invention is an addition-polymerizable compound having at least one ethylenically unsaturated double bond and is selected from the compounds having at least one, preferably two or more, terminal ethylenically unsaturated bonds. These compounds have a chemical form such as monomer, prepolymer (i.e., dimmer, trimer or oligomer), or a mixture thereof. Examples of monomer include an unsaturated carboxylic acid (such as acrylic acid, methacrylic acid, itaconic acid, crotonic acid, isocrotonic acid and maleic acid), and esters and amides thereof, and esters of an unsaturated carboxylic acid with a polyhydric alcohol compound, and amides of an unsaturated carboxylic acid with a polyvalent amine compound are preferably used. In addition, for example, an addition reaction product of unsaturated carboxylic acid esters or amides having a nucleophilic substituent such as hydroxy group, amino group and mercapto group, with monofunctional or polyfunctional isocyanates or epoxies, and a dehydration condensation reaction product of the unsaturated carboxylic acid esters or amides with a monofunctional or polyfunctional carboxylic acid are preferably used. Furthermore, an addition reaction product of unsaturated carboxylic acid esters or amides having an electrophilic substituent such as isocyanate group and epoxy group, with monofunctional or polyfunctional alcohols, amines or thiols, and a substitution reaction product of unsaturated carboxylic acid esters or amides having a leaving substituent such as halogen atom and tosyloxy group, with monofunctional or polyfunctional alcohols, amines or thiols are also preferred. As other examples, compounds in which the unsaturated carboxylic acid above is replaced by an unsaturated phosphonic acid, a styrene or an vinyl ether can be also used. These are described in reference documents including JP-T-2006-508380, JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187, and JP-A-10-333321.

Specific examples of the ester monomer of a polyhydric alcohol with an aliphatic carboxylic acid include; as the acrylic acid ester, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, and polyester acrylate oligomer; and as the methacrylic acid ester, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane, and bis[p-(methacryloxyethoxy)phenyl]dimethylmethane. Also, specific examples of the amide monomer of a polyvalent amine compound with an unsaturated carboxylic acid include methylene bis-acrylamide, methylene bis-methacrylamide, 1,6-hexamethylene bis-acrylamide, 1,6-hexamethylene bis-methacrylamide, diethylenetriamine trisacrylamide, xylylene bisacrylamide, and xylylene bismethacrylamide.

A urethane-based addition-polymerizable compound produced using an addition reaction of an isocyanate with a hydroxy group is also preferred, and specific examples thereof include a vinyl urethane compound having two or more polymerizable vinyl groups per molecule, which is obtained by adding a hydroxy group-containing vinyl monomer represented by the following formula (A) to a polyisocyanate compound having two or more isocyanate groups per molecule, described in JP-B-48-41708 (the term "JP-B" as used herein means an "examined Japanese patent publication"):

$$H_2C=C(R^4)COOCH_2CH(R^5)OH \qquad (A)$$

(wherein each of $R^4$ and $R^5$ independently represents H or $CH_3$).

In addition, urethane acrylates described in JP-A-51-37193, JP-B-2-32293, JP-B-2-16765, JP-A-2003-344997 and JP-A-2006-65210, urethane compounds having an ethylene oxide-based skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are also preferred.

Among these, in view of excellent balance between the hydrophilicity responsible for on-press developability and the polymerization ability responsible for press life, isocyanuric acid ethylene oxide-modified acrylates such as tris(acryloyloxyethyl) isocyanurate and bis(acryloyloxyethyl) hydroxyethyl isocyanurate are preferred.

Details of the use method of the polymerizable compound, such as structure, use alone or in combination, and amount added, can be arbitrarily designed according to the performance design of the final lithographic printing plate precursor. The polymerizable compound is used in an amount of preferably from 5 to 75 mass %, more preferably from 10 to 70 mass %, still more preferably from 15 to 60 mass %, based on the entire solid content of the image-recording layer.

(Low Molecular Hydrophilic Compound)

The image-recording layer for use in the present invention may contain a low molecular hydrophilic compound so as to enhance the on-press developability without reducing the press life.

Examples of the low molecular hydrophilic compound include, as the water-soluble organic compound, glycols such as ethylene glycol, diethylene glycol, triethylene glycol, propylene glycol, dipropylene glycol and tripropylene glycol, and ether or ester derivatives thereof; polyhydroxys such as glycerin, pentaerythritol and tris(2-hydroxyethyl)isocyanurate; organic amines such as triethanolamine, diethanolamine and monoethanolamine, and salts thereof; organic sulfonic acids such as toluenesulfonic acid and benzenesulfonic acid, and salts thereof; organic sulfamic acids such as alkylsulfamic acid, and salts thereof; organic sulfuric acids such as alkylsulfuric acid and alkyl ether sulfuric acid, and salts thereof; organic phosphonic acids such as phenylphosphonic acid, and salts thereof; organic carboxylic acids such as tartaric acid, oxalic acid, citric acid, malic acid, lactic acid, gluconic acid and amino acids, and salts thereof; and betaines.

Among these, in the present invention, it is preferred to contain at least one selected from the group consisting of polyols, organic sulfates, organic sulfonates and betaines.

Specific examples of the organic sulfonate compound include an alkylsulfonate such as sodium n-butylsulfonate, sodium n-hexylsulfonate, sodium 2-ethylhexylsulfonate, sodium cyclohexylsulfonate and sodium n-octylsulfonate; an ethylene oxide chain-containing alkylsulfonate such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate and sodium 5,8,11,14-tetraoxatetradecosane-1-sulfonate; and an arylsulfonate such as sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphthylsulfonate, sodium 4-hydroxynaphthylsulfonate, disodium 1,5-naphthalenedisulfonate and trisodium 1,3,6-naphthalenetrisulfonate. The salt may be also a potassium salt or a lithium salt.

The organic sulfate includes a sulfate of alkyl, alkenyl, alkynyl, aryl or heterocyclic monoether of polyethylene oxide. The number of ethylene oxide units is preferably from 1 to 4. The salt is preferably a sodium salt, a potassium salt or a lithium salt.

As the betaines, a compound in which the hydrocarbon substituent on the nitrogen atom has a carbon atom number of 1 to 5 is preferred, and specific examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-propanesulfonate and 3-(1-pyridinio)-1-propanesulfonate.

The low molecular hydrophilic compound above has almost no surface active function because the structure of the hydrophobic portion is small, so that the image area can be prevented from reduction in the hydrophobicity or film strength due to penetration of the fountain solution into the exposed area (image area) of the image-recording layer and the ink receptivity and press life of the image-recording layer can be successfully maintained.

The amount of the low molecular hydrophilic compound added to the image-recording layer is preferably from 0.5 to 20 mass %, more preferably from 1 to 15 mass %, still more preferably from 2 to 10 mass %, based on the entire solid content of the image-recording layer. Within this range, good on-press developability and good press life are obtained.

One of these compounds may be used alone, or two or more thereof may be mixed and used.

(Oil-Sensitizing Agent)

As regards the image-recording layer for use in the present invention, in order to enhance the ink receptivity, an oil-sensitizing agent such as phosphonium compound, nitrogen-containing low molecular compound and ammonium group-containing polymer can be used in the image-recording layer. Particularly, in the case of incorporating an inorganic layered compound into the protective layer, the compound above functions as a surface covering agent of the inorganic layered compound and prevents the ink receptivity from deteriorating during printing due to the inorganic layered compound.

Suitable phosphonium compounds include phosphonium compounds described in JP-A-2006-297907 and JP-A-2007-50660. Specific examples thereof include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, and 1,9-bis(triphenylphosphonio)nonane=naphthalene-2,7-disulfonate.

The nitrogen-containing low molecular compound includes amine salts and quaternary ammonium salts and also includes imidazolinium salts, benzimidazolinium salts, pyridinium salts and quinolinium salts. Among these, quaternary ammonium salts and pyridinium salts are preferred. Specific examples include tetramethylammonium=hexafluorophosphate, tetrabutylammonium=hexafluorophosphate, dodecyltrimethylammonium=p-toluenesulfonate, benzyltriethylammonium=hexafluorophosphate, benzyldimethyloctylammonium=hexafluorophosphate, benzyldimethyldodecylammonium=hexafluorophosphate, and compounds described in paragraphs [0021] to [0037] of JP-A-2008-284858 and paragraphs [0030] to [0057] of JP-A-2009-90645.

The ammonium group-containing polymer may be any polymer as long as it has an ammonium group in its structure, but a polymer containing, as a copolymerization component, from 5 to 80 mol % of (meth)acrylate having an ammonium group in the side chain is preferred. Specific examples thereof include polymers described in paragraphs [0089] to [0105] of JP-A-2009-208458.

The ammonium salt-containing polymer is preferably a polymer where the value of the reduced specific viscosity (unit: ml/g) determined by the following measurement method is from 5 to 120, more preferably from 10 to 110, still more preferably from 15 to 100. The mass average molar mass (Mw) converted from the reduced specific viscosity is preferably from 10,000 to 150,000, more preferably from 17,000 to 140,000, still more preferably from 20,000 to 130,000.

<Method for Measuring Reduced Specific Viscosity>

In a 20 ml-volume measuring flask, 3.33 g of a 30% polymer solution (1 g as solid content) is weighed, and the measuring flask is filled up to the gauge line with N-methylpyrrolidone. The solution is left standing still in a constant temperature bath at 30° C. for 30 minutes and then put in an Ubbelohde reduced specific viscosity tube (viscometer constant=0.010 cSt/s), and the time for which the solution runs down is measured at 30° C. Incidentally, the measurement is performed twice for the same sample, and the average value is calculated. The same measurement is performed for the blank (only N-methylpyrrolidone), and the reduced specific viscosity (ml/g) is calculated according to the following formula.

$$\text{Reduced specific viscosity(ml/g)} = \frac{\frac{\text{Efflux time of sample solution(sec)} - \text{Efflux time of blank(sec)}}{\text{Efflux time of blank (sec)}}}{3.33(g) \times \frac{30}{100}}$$

Specific examples of the ammonium group-containing polymer are set forth below.

(1) 2-(Trimethylammonio)ethyl methacrylate=p-toluenesulfonate/3,6-dioxaheptyl methacrylate copolymer (molar ratio: 10/90, Mw: 45,000)

(2) 2-(Trimethylammonio)ethyl methacrylate=hexafluorophosphate/3,6-dioxaheptyl methacrylate copolymer (molar ratio: 20/80, Mw: 60,000)

(3) 2-(Ethyldimethylammonio)ethyl methacrylate=p-toluenesulfonate/hexyl methacrylate copolymer (molar ratio: 30/70, Mw: 45,000)

(4) 2-(Trimethylammonio)ethyl methacrylate=hexafluorophosphate/2-ethylhexyl methacrylate copolymer (molar ratio: 20/80, Mw: 60,000)

(5) 2-(Trimethylammonio)ethyl methacrylate=methyl sulfate/hexyl methacrylate copolymer (molar ratio: 40/60, Mw: 70,000)

(6) 2-(Butyldimethylammonio)ethyl methacrylate=hexafluorophosphate/3,6-dioxaheptyl methacrylate copolymer (molar ratio: 25/75, Mw: 65,000)

(7) 2-(Butyldimethylammonio)ethyl acrylate=hexafluorophosphate/3,6-dioxaheptyl methacrylate copolymer (molar ratio: 20/80, Mw: 65,000)

(8) 2-(Butyldimethylammonio)ethyl methacrylate=13-ethyl-5,8,11-trioxa-1-heptadecanesulfonate/3,6-dioxaheptyl methacrylate copolymer (molar ratio: 20/80, Mw: 75,000)

(9) 2-(Butyldimethylammonio)ethyl methacrylate=hexafluorophosphate/3,6-dioxaheptyl methacrylate/2-hydroxy-3-methacryloyloxypropyl methacrylate copolymer (molar ratio: 15/80/5, Mw: 65,000)

The content of the oil-sensitizing agent is preferably from 0.01 to 30.0 mass %, more preferably from 0.1 to 15.0 mass %, still more preferably from 1 to 10 mass %, based on the entire solid content of the image-recording layer.

(Other Components)

Furthermore, other components such as surfactant, colorant, printout agent, polymerization inhibitor, higher fatty acid derivative, plasticizer, inorganic fine particle, inorganic layered compound and co-sensitizer or chain transfer agent may be added. Specifically, compounds and amounts added described in paragraphs [0114] to [0159] of JP-A-2008-284817, paragraphs [0023] to [0027] of JP-A-2006-091479 and paragraph [0060] of U.S. Patent Application Publication No. 2008/0311520 are preferred.

(Formation of Image-Recording Layer)

In the present invention, the image-recording layer is formed, as described in paragraphs [0142] to [0143] of JP-A-2008-195018, by dispersing or dissolving each of the necessary components above in a known solvent to prepare a coating solution, coating the solution on a support by a known method such as bar coater coating, and drying the coating. The coating amount (solid content) of the image-recording layer obtained on a support after coating and drying may vary according to usage but in general, is preferably from 0.3 to 3.0 g/m$^2$. Within this range, good sensitivity and good film characteristics of the image-recording layer can be obtained.

[Undercoat Layer]

In the lithographic printing plate precursor of the present invention, an undercoat layer (sometimes referred to as an interlayer) is preferably provided between the image-recording layer and the support. The undercoat layer makes it possible to strengthen adhesion between the support and the image-recording layer in the exposed area and readily remove the image-recording layer from the support in the unexposed area and therefore, contributes to improving the on-press developability without impairing the press life. Also, in the case of infrared laser exposure, the undercoat layer functions as a heat insulating layer and in turn, prevents heat generated upon exposure from diffusing into the support to decrease the sensitivity.

The compound for use in the undercoat layer is preferably a compound having an adsorptive group capable of adsorbing to the support surface and a crosslinking group so as to enhance the adhesion to the image-recording layer. Furthermore, preferred compounds also include a compound having a hydrophilicity-imparting group such as sulfo group. These compounds may be either a low molecular compound or a high molecular polymer. Also, two or more of these compounds may be mixed and used, if desired.

In the case of a high molecular polymer, a copolymer of a monomer having an adsorptive group, a monomer having a hydrophilic group and a monomer having a crosslinking group is preferred. The absorptive group capable of adsorbing the support surface is preferably a phenolic hydroxy group, a carboxy group, $-PO_3H_2$, $-OPO_3H_2$, $-CONHSO_2-$, $-SO_2NHSO_2-$ or $-COCH_2COCH_3$. The hydrophilic group is preferably a sulfo group. The crosslinking group is preferably a methacryl group, an allyl group or the like.

The high molecular polymer may have a crosslinking group introduced in the form of forming a salt between a polar substituent of the high molecular polymer and a compound containing a substituent having a counter charge and an ethylenically unsaturated bond, and a monomer other than those described above, preferably a hydrophilic monomer, may be further copolymerized.

Specifically, a silane coupling agent having an addition-polymerizable ethylenic double bond reactive group described in JP-A-10-282679, and a phosphorus compound having an ethylenic double bond reactive group described in JP-A-2-304441 are preferred. Also, a polymer containing a low molecular or high molecular compound having a crosslinking group (preferably an ethylenically unsaturated bond group), a functional group capable of interacting with the support surface, and a hydrophilic group described in JP-A-2005-238816, JP-A-2005-125749, JP-A-2006-239867 and JP-A-2006-215263 is preferably used.

A high molecular polymers having an adsorptive group capable of adsorbing the support surface, a hydrophilic group and a crosslinking group described in JP-A-2005-125749 and JP-A-2006-188038 is more preferred.

The content of the unsaturated double bond in the polymer resin for the undercoat layer is preferably from 0.1 to 10.0 mmol, most preferably from 0.2 to 5.5 mmol, per g of the high molecular polymer.

The high molecular polymer for the undercoat layer preferably has a mass average molar mass of 5,000 or more, more preferably from 10,000 to 300,000.

The undercoat layer for use in the present invention may contain, in addition to the above-described compounds for the undercoat layer, a chelating agent, a secondary or tertiary amine, a polymerization inhibitor, a compound containing an amino group or a functional group having a polymerization inhibiting ability and a group capable of interacting with the aluminum support surface (for example, 1,4-diazobicyclo[2, 2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid and hydroxyethyliminodiacetic acid), or the like so as to prevent staining with aging.

The undercoat layer is coated by a known method. The coating amount (solid content) of the undercoat layer is preferably from 0.1 to 100 mg/m$^2$, more preferably from 1 to 30 mg/m$^2$.

[Support]

As for the support used in the lithographic printing plate precursor of the present invention, a known support is used. Above all, an aluminum plate subjected to a roughening treatment and an anodizing treatment by known methods is preferred.

Also, an enlarging treatment or sealing treatment for micropores of the anodized film described in JP-A-2001-253181 and JP-A-2001-322365, and a surface hydrophilizing treatment, for example, with an alkali metal silicate described in U.S. Pat. Nos. 2,714,066, 3,181,461, 3,280,734 and 3,902,734 or a polyvinylphosphonic acid described in U.S. Pat. Nos. 3,276,868, 4,153,461 and 4,689,272, may be appropriately selected and applied to the aluminum plate, if desired.

The support preferably has a centerline average roughness of 0.10 to 1.2 μm.

In the support for use in the present invention, a backcoat layer containing an organic polymer compound described in JP-A-5-45885 or an alkoxy compound of silicon described in JP-A-6-35174, may be provided on the back surface, if desired.

[Protective Layer]

In the lithographic printing plate precursor of the present invention, a protective layer (overcoat layer) is preferably provided on the image-recording layer. The protective layer has a function of blocking oxygen and thereby preventing an image formation inhibition reaction and additionally has functions of preventing generation of scratches in the image-recording layer and preventing ablation during exposure to a high illuminance laser.

The protective layer having such properties is described, for example, in U.S. Pat. No. 3,458,311 and JP-B-55-49729. As the low-oxygen-permeable polymer used for the protective layer, either a water-soluble polymer or a water-insoluble polymer can be appropriately selected and used, and two or more kinds of polymers may be also mixed and used, if desired. Specific examples of the polymer include a polyvinyl alcohol, a modified polyvinyl alcohol, a polyvinylpyrrolidone, a water-soluble cellulose derivative, and a poly(meth)acrylonitrile.

The modified polyvinyl alcohol which is preferably used is an acid-modified polyvinyl alcohol having a carboxy group or a sulfo group. Specifically, modified polyvinyl alcohols described in JP-A-2005-250216 and JP-A-2006-259137 are preferred.

In addition, as described in JP-A-2005-119273, the protective layer preferably contains an inorganic layered compound such as natural mica and synthetic mica so as to increase the oxygen blocking property.

Furthermore, the protective layer may contain known additives, for example, a plasticizer to impart flexibility, a surfactant to enhance the coatability, and an inorganic fine particle to control the surface slipperiness. Also, an oil-sensitizing agent described with respect to the image-recording layer may be incorporated into the protective layer.

The protective layer is coated by a known method. The coating amount of the protective layer is, in terms of the coating amount after drying, preferably from 0.01 to 10 g/m$^2$, more preferably from 0.02 to 3 g/m$^2$, and most preferably from 0.02 to 1 g/m$^2$.

[Plate Making Method]

Plate making of the lithographic printing plate precursor of the present invention is preferably performed by an on-press development method. The on-press development method comprises a step of imagewise exposing the lithographic printing plate precursor and a printing step of performing printing by supplying an oily ink and an aqueous component without applying any development processing to the lithographic printing plate precursor after exposure and is characterized in that the unexposed area of the lithographic printing plate precursor is removed in the course of the printing step. The imagewise exposure may be performed on a printing machine after loading the lithographic printing plate precursor or may be separately performed by a plate setter or the like. In the latter case, the exposed lithographic printing plate precursor is loaded as it is on the printing machine without passing through a development processing step. Thereafter, using the printing machine, printing is directly performed by supplying an oily ink and an aqueous component, whereby on-press development processing, that is, removal of the image-recording layer in the unexposed region, is executed at the initial stage in the course of printing and the surface of the hydrophilic support is bared to form a non-image area. As the oily ink and the aqueous component, a printing ink and a fountain solution for normal lithographic printing are used.

The plate making method is described in more detail below.

In the present invention, the light source used for imagewise exposure is preferably a laser. The laser for use in the present invention is not particularly limited but includes, for example, a solid laser or semiconductor laser emitting an infrared ray having a wavelength of 760 to 1,200 nm.

As for the infrared laser, the output is preferably 100 mW or more, the exposure time per pixel is preferably within 20 microseconds, and the amount of irradiation energy is preferably from 10 to 300 mJ/cm$^2$. In using the laser, a multi-beam laser device is preferably used so as to shorten the exposure time.

The exposed lithographic printing plate precursor is loaded on the plate cylinder of the printing machine. In case of a printing machine equipped with a laser exposure device, the imagewise exposure is performed after loading the lithographic printing plate precursor on the plate cylinder of the printing machine.

When printing is performed by supplying a fountain solution and a printing ink to the imagewise exposed lithographic printing plate precursor, in the exposed area of the image-recording layer, the image-recording layer cured by exposure forms a printing ink-receiving part having an ink-receptive surface. On the other hand, in the unexposed area, the uncured image-recording layer is dissolved or dispersed in the supplied fountain solution and/or printing ink and thereby removed to bare the hydrophilic surface in that portion. As a result, the fountain solution adheres to the bared hydrophilic surface, and the printing ink is impressed on the image recording layer in the exposed portion, whereby printing is started.

Here, either a fountain solution or a printing ink may be supplied first to the plate surface, but from the standpoint of preventing the fountain solution from contamination with a component of the image-recording layer removed, a printing ink is preferably supplied first.

In this way, the lithographic printing plate precursor of the present invention is on-press developed on an offset printing machine and directly used for printing on a large number of sheets.

EXAMPLES

The present invention is described in greater detail below by referring to Examples, but the present invention should not be construed as being limited thereto. Incidentally, with respect to the polymer compound, unless otherwise specified, the molecular weight is the mass average molar mass (Mw), and the proportion of the repeating unit is a molar percentage.

[Synthesis Example of Microgel]

In synthesis examples, M-1, I-1, IR-1, SP-3 and the like as the components (A) to (D) indicate the exemplified compound number referred to in the description of respective components.

Synthesis of Microgel (MG-1) Described in Example 1:

As the oil phase component, 4.46 g of a polyfunctional isocyanate having a structure shown below (produced by Mitsui Chemicals Polyurethanes, Inc.; 75% ethyl acetate solution), 10 g of an adduct obtained by adding trimethylolpropane (6 mol) and xylene diisocyanate (18 mol) and adding thereto a polyoxyethylene terminated by methyl at one end (1 mol, number of oxyethylene repeating units: 90) (produced by Mitsui Takeda Chemicals, Inc.; 50% ethyl acetate solution), 3.0 g of Monomer M-1 for the component (A), 0.02 g of polymerization initiator V-60 (produced by Wako Pure Chemical Industries, Ltd.), 2.0 g of 1-2 as the component (B), 0.8 g of IR-1 as the component (C) and 0.1 g of Pionin A-41C (produced by Takemoto Oil & Fat Co., Ltd.) were dissolved in 7 g of ethyl acetate and 10 g of methyl ethyl ketone. As the aqueous phase, 30 g of distilled water was prepared. The oil phase component and the aqueous phase component were mixed, and the mixture was emulsified at 12,000 rpm for 10 minutes by using a homogenizer. The obtained emulsion was added to 20 g of distilled water, and the mixture was stirred at room temperature for 30 minutes and then stirred at 50° C. for 3 hours. The thus-obtained microgel solution was diluted with distilled water to have a solid content concentration of 15 mass %, and this was used as the microgel. The average particle diameter of the microgel was measured by the light scattering method, as a result, the average particle diameter was 0.2

Polyfunctional Isocyanate:

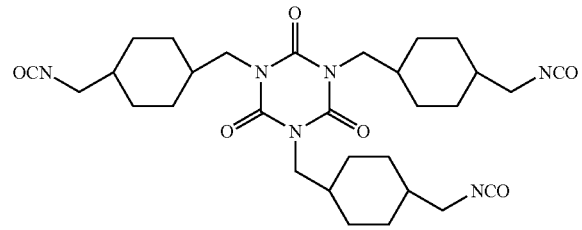

Synthesis of Microgel (MG-10) Described in Example 11:

MG-10 was obtained by performing the synthesis in the same manner as that of MG-1 except for adding 3.0 g of M-2 as the component (A), 2.0 g of 1-1 as the component (B), 0.8 g of IR-5 as the component (C), and 2.0 g of SP-3 as the component (D) to the oil phase component. The average particle diameter of the microgel was measured by the light scattering method, as a result, the average particle diameter was 0.2 μm.

Synthesis of Microgel (MG-48) Described in Example 49:

MG-48 was obtained by performing the synthesis in the same manner as that of MG-1 except for using 2.1 g of M-1 and 0.9 g of M-2 as monomers for the component (A), 2.0 g of 1-1 as the component (B), and 2.0 g of SP-13 as the component (D). The average particle diameter of the microgel was measured by the light scattering method, as a result, the average particle diameter was 0.2 μm.

Synthesis of Microgel (MG-49) Described in Example 50:

MG-49 was obtained by performing the synthesis in the same manner as that of MG-1 except for using 2.1 g of M-1 and 0.9 g of M-3 as monomers for the component (A), 2.0 g of 1-1 as the component (B), and 2.0 g of SP-13 as the component (D). The average particle diameter of the microgel was measured by the light scattering method, as a result, the average particle diameter was 0.2 μm.

Synthesis of Microgel (MG-50) Described in Example 51:

MG-50 was obtained by performing the synthesis in the same manner as that of MG-1 except for using 2.1 g of M-1 and 0.9 g of M-5 as monomers for the component (A), 2.0 g of 1-1 as the component (B), and 2.0 g of SP-13 as the component (D). The average particle diameter of the microgel was measured by the light scattering method, as a result, the average particle diameter was 0.2 μm.

Synthesis of Microgel (MG-51) Described in Example 52:

MG-51 was obtained by performing the synthesis in the same manner as that of MG-1 except for using 2.1 g of M-1 and 0.9 g of M-8 as monomers for the component (A), 2.0 g of 1-1 as the component (B), and 2.0 g of SP-13 as the component (D). The average particle diameter of the microgel was measured by the light scattering method, as a result, the average particle diameter was 0.2 μm.

Synthesis of Microgel (MG-58) Described in Comparative Example 8:

MG-58 was obtained by performing the synthesis in the same manner as that of MG-1 except for using 1.95 g of M-1 and 1.05 g of normal hexyl methacrylate (M-14) as monomers for the component (A). The average particle diameter of the microgel was measured by the light scattering method, as a result, the average particle diameter was 0.2 μm.

Synthesis of Microgel (MG-59) Described in Comparative Example 9:

MG-59 was obtained by performing the synthesis in the same manner as that of MG-1 except for using 3.00 g of normal butyl methacrylate (M-13) as a monomer for the component (A). The average particle diameter of the microgel was measured by the light scattering method, as a result, the average particle diameter was 0.2 μm.

Example 1 and Comparative Example 1

Photosensitive Composition (1) Production of Coloring Photosensitive Composition Film 1

Photosensitive Composition Solution (1) shown below was prepared, bar-coated on a 0.18 mm-thick polyester film to give a dry coating amount of 1.0 g/m², and then dried in an oven at 100° C. for 60 seconds to produce Coloring Photosensitive Composition Film 1.

| <Photosensitive Composition Solution (1)> | |
|---|---|
| Binder Polymer (1) [having a structure shown below] | 0.636 g |
| Microgel (MG-1) | 1.900 g |
| Fluorine-Containing Surfactant (1) [having a structure shown below] | 0.008 g |
| 2-Butanone | 1.091 g |
| 1-Methoxy-2-propanol | 8.609 g |

Structures of Binder Polymer (1) and Fluorine-Containing Surfactant (1) are shown below.

Binder Polymer (1):

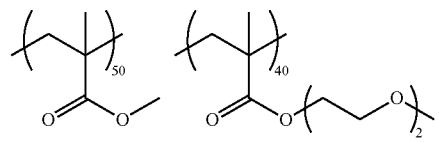

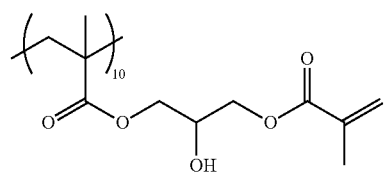

(Mw 70,000)

Fluorine-Containing Surfactant (1):

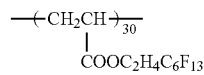

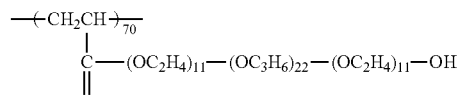

(Mw 13,000)

(2) Production of Coloring Photosensitive Composition Films 2 to 4

Coloring Photosensitive Composition Films 2 to 4 (for Comparative Examples 1 to 3) were produced in the same manner as in the production of Coloring Photosensitive Composition Film 1 except for using the microgel shown in Table 1 in place of Microgel (MG-1) of Photosensitive Solution (1).

(3) Evaluation of Coloring Photosensitive Composition Film

Each of the coloring photosensitive composition films obtained was exposed using Trendsetter 3244VX manufactured by Creo Co., having mounted thereon a water-cooled 40 W infrared semiconductor laser, under the conditions of an output of 11.7 W, a rotation speed of external drum of 250 rpm and a resolution of 2,400 dpi.

Coloring was measured immediately after exposure and after elapse of 2 hours under the conditions of dark place and room temperature from exposure. Coloring immediately after exposure was also measured on a photosensitive composition film forcedly aged for 3 days under the conditions of 60° C. and a humidity of 70% RH.

Coloring was denoted by the difference $\Delta L$ between L value of the exposed area and L value of the unexposed area by using L value (brightness) of the L*a*b* color system. A larger value of $\Delta L$ indicates a higher coloring property. The measurement was performed according to the SCE (specular component excluded) system by using spectral colorimeter CM2600d and operation software CM-S100 W both produced by KONICA-MINOLTA. The results are shown in Table 1.

TABLE 1

Example 1 and Comparative Examples 1 to 3

| | Coloring Photosensitive Composition Film | Microgel Synthesized | (A) Polymer of Tg > 50° C. or more Constituent Monomer | Tg (° C.) | (B) Photo initiator | (C) Infrared Absorbing Dye | ΔL Immediately After Exposure | 2 Hours After Exposure | After Forced Aging |
|---|---|---|---|---|---|---|---|---|---|
| Example 1 | 1 | MG-1 | M-1 | 105 | I-2 | IR-1 | 5.5 | 4.0 | 5.0 |
| Comparative Example 1 | 2 | MG-54 | none | — | I-2 | IR-1 | 5.0 | 1.5 | 4.5 |
| Comparative Example 2 | 3 | MG-56 | M-2 | 117 | I-2 | none | 0.0 | 0.0 | 0.0 |
| Comparative Example 3 | 4 | MG-57 | M-2 | 117 | none | IR-1 | 0.5 | 0.5 | 0.5 |

Incidentally, microgels MG-54, MG-56 and MG-57 in Table 1 were synthesized in the same manner as microgel MG-1 except for using those shown in Table 1 as the components (A) to (C).

As apparent from the results in Table 1, when the coloring photosensitive composition of the present invention is used, high coloring is obtained and moreover, high coloring is maintained even with the elapse of time after coloring. Furthermore, coloring stability is good and high coloring is obtained even when the composition film coated is exposed after forced aging.

Examples 2 to 54 and Comparative Examples 4 to 10

Lithographic Printing Plate Precursor

1. Production of Lithographic Printing Plate Precursors (1) to 51) and (54) to (60)
(1) Production of Support An aluminum plate (material: JIS A 1050) having a thickness of 0.3 mm was subjected to a degreasing treatment with an aqueous 10 mass % sodium aluminate solution at 50° C. for 30 seconds so as to remove the rolling oil on the surface and thereafter, the aluminum surface was grained using three nylon brushes implanted with bundled bristles having a diameter of 0.3 mm and an aqueous suspension (specific gravity: 1.1 g/cm$^3$) of pumice having a median diameter of 25 μm and then thoroughly washed with water. The plate was etched by dipping it in an aqueous 25 mass % sodium hydroxide solution at 45° C. for 9 seconds and after washing with water, dipped in 20 mass % nitric acid at 60° C. for 20 seconds, followed by washing with water. The etching amount of the grained surface was about 3 g/m$^2$.

Subsequently, a continuous electrochemical surface roughening treatment was performed using an alternate current voltage of 60 Hz. The electrolytic solution used here was an aqueous 1 mass % nitric acid solution (containing 0.5 mass % of aluminum ion) at a liquid temperature of 50° C. The electrochemical surface roughening treatment was performed using a rectangular wave alternate current having a trapezoidal waveform such that the time TP necessary for the current value to reach the peak from zero was 0.8 msec and the duty ratio was 1:1, and disposing a carbon electrode as the counter electrode. The auxiliary anode used was ferrite. The current density was 30 A/dm$^2$ in terms of the peak value of current, and 5% of the current flowing from the power source was divided to the auxiliary anode. The quantity of electricity at the nitric acid electrolysis was 175 C/dm$^2$ when the aluminum plate was serving as the anode. The aluminum plate was then washed with water by spraying.

Subsequently, an electrochemical surface roughening treatment was performed in the same manner as in the nitric acid electrolysis above by using, as the electrolytic solution, an aqueous 0.5 mass % hydrochloric acid solution (containing 0.5 mass % of aluminum ion) at a liquid temperature of 50° C. under the conditions that the quantity of electricity was 50 C/dm$^2$ when the aluminum plate was serving as the anode, and then washed with water by spraying.

The plate was then treated in an aqueous 15 mass % sulfuric acid solution (containing 0.5 mass % of aluminum ion) as the electrolytic solution at a current density of 15 A/dm$^2$ to provide a direct current anodic oxide film of 2.5 g/m$^2$, thereafter washed with water and dried to produce Support (1).

Furthermore, in order to ensure hydrophilicity of the non-image area, Support (1) was subjected to a silicate treatment using an aqueous 2.5 mass % sodium No. 3 silicate solution at 60° C. for 10 seconds and then washed with water to obtain Support (2). The amount of Si attached was 10 mg/m$^2$. The centerline average roughness (Ra) of this substrate was measured using a stylus having a diameter of 2 ƒm and found to be 0.51 μm.
(2) Formation of Undercoat Layer Next, Coating Solution (1) for Undercoat Layer shown below was coated on Support (2) to have a dry coating amount of 20 mg/m$^2$, thereby producing a support having an undercoat layer, which is used in the following experiments.

| <Coating Solution (1) for Undercoat Layer> | |
|---|---|
| Compound (1) for Undercoat Layer, having a structure shown below | 0.18 g |
| Hydroxyethyliminodiacetic acid | 0.10 g |
| Methanol | 55.24 g |
| Water | 6.15 g |

Compound (1) for Undercoat Layer:

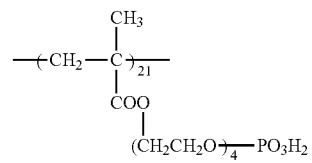

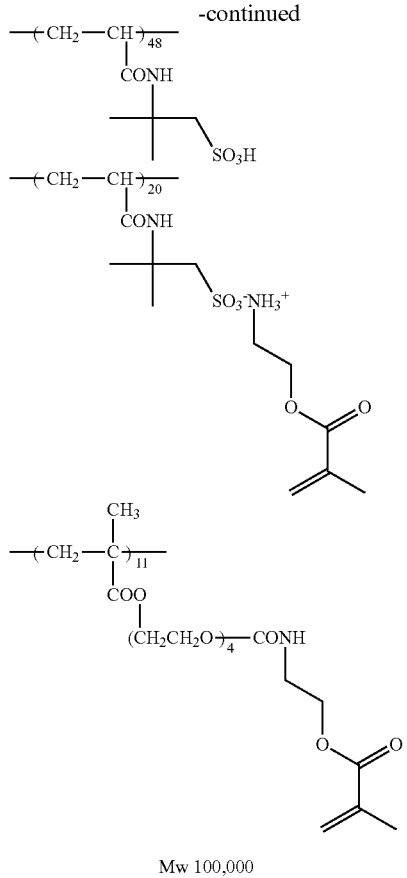

Mw 100,000

(3) Formation of Image-Recording Layer

Coating solution (1) for Image-Recording Layer having the composition shown below was bar-coated on the undercoat layer formed above, and dried in an oven at 100° C. for 60 seconds to form an image-recording layer having a dry coating amount of 1.0 g/m².

| <Coating Solution (1) for Image-Recording Layer> | |
|---|---|
| Binder Polymer (1) [having a structure shown above] | 0.240 g |
| Microgel (microgel synthesized, shown in Tables 2 to 4) | 1.900 g |
| Cyanine Dye [IR-1] | 0.015 g |
| Photoinitiator [I-2] | 0.100 g |
| Polymerizable compound: tris(acryloyloxyethyl)isocyanurate (NK ESTER A-9300, produced by Shin-Nakamura Chemical Co., Ltd.) | 0.192 g |
| Low molecular hydrophilic compound: tris(2-hydroxyethyl)isocyanurate | 0.062 g |
| Low Molecular Hydrophilic Compound (1) [having a structure shown below] | 0.050 g |
| Oil-sensitizing agent: Phosphonium Compound (1) [having a structure shown below] | 0.055 g |
| Oil-sensitizing agent: benzyl-dimethyl-octyl ammonium•PF₆ salt | 0.018 g |
| Oil-sensitizing agent: ammonium group-containing polymer [having structure shown below, reduced viscosity: 44 ml/g] | 0.035 g |
| Fluorine-Containing Surfactant (1) [having a structure shown above] | 0.008 g |
| 2-Butanone | 1.091 g |
| 1-Methoxy-2-propanol | 8.609 g |

Structures of Low Molecular Hydrophilic Compound (1), Phosphonium Compound (1) and the ammonium group-containing polymer are shown below.

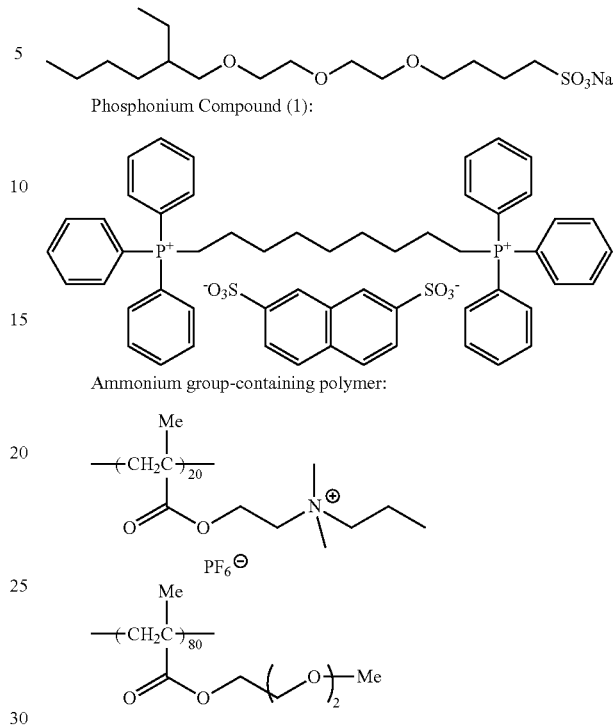

(4) Formation of Protective Layer

Protective Layer Coating Solution (1) having the composition shown below was bar-coated on the image-recording layer above and dried in an oven at 120° C. for 60 seconds to form a protective layer having a dry coating amount of 0.15 g/m², thereby obtaining Lithographic Printing Plate Precursors (1) to (51) [for Examples 2 to 52] and Lithographic Printing Plate Precursors (54) to (60) [for Comparative Examples 4 to 10].

| <Protective Layer Coating Solution (1)> | |
|---|---|
| Inorganic Layered Compound Liquid Dispersion (1) | 1.5 g |
| Aqueous 6 mass % polyvinyl alcohol (CKS 50, sulfonic acid-modified, saponification degree: 99 mol % or more, polymerization degree: 300, produced by Nippon Synthetic Chemical Industry Co., Ltd.) solution | 0.55 g |
| Aqueous 6 mass % polyvinyl alcohol (PVA-405, saponification degree: 81.5 mol %, polymerization degree: 500, produced by Kuraray Co., Ltd.) solution | 0.03 g |
| Aqueous 1 mass % surfactant (EMALEX 710, produced by Nihon Emulsion Co., Ltd.) solution | 0.86 g |
| Ion-exchanged water | 6.0 g |

(Preparation of Inorganic Layered Compound Liquid Dispersion (1))

To 193.6 g of ion-exchanged water, 6.4 g of synthetic mica SOMASIF ME-100 (produced by CO—OP Chemical Co., Ltd.) was added, and the mixture was dispersed using a homogenizer until the average particle diameter (according to laser scattering method) became 3 μm. The aspect ratio of the dispersed particles obtained was 100 or more.

2. Production of Lithographic Printing Plate Precursors (52) and (53)

Lithographic Printing Plate Precursors (52) and (53) [for Examples 53 and 54] were produced in the same manner as Lithographic Printing Plate Precursors (2) and (23), respectively, except for using Protective Layer Coating Solution (2) prepared by not adding Inorganic Layered Compound Liquid Dispersion (1) in Protective Layer Coating Solution (1).

3. Evaluation of Lithographic Printing Plate Precursor (1) Suitability for Plate Inspection Each of Lithographic Printing Plate Precursors (1) to (60) obtained was exposed using Trendsetter 3244VX manufactured by Creo Co., having mounted thereon a water-cooled 40 W infrared semiconductor laser, under the conditions of an output of 11.7 W, a rotation speed of external drum of 250 rpm and a resolution of 2,400 dpi. The ease of plate inspection was denoted by the difference ΔL between L value of the exposed area and L value of the unexposed area by using L value (brightness) of the L*a*b* color system. A larger value of ΔL indicates a higher suitability for plate inspection. The measurement was performed according to the SCE (specular component excluded) system by using spectral colorimeter CM2600d and operation software CM-S100 W both produced by KONICA-MINOLTA. According to the SCE system, since specular light is excluded and only diffusion light is measured, the evaluation is close to evaluation of color with an eye, and the result well correlates with plate inspection performed by human in practice. Measurement of ΔL was performed three times in total, that is, immediately after exposure, after elapse of 2 hours at room temperature from exposure, and immediately after exposure of a printing plate precursor stored at 60° C. for 2 days. The results are shown in Tables 2 to 4.

(2) On-Press Developability

Each of the lithographic printing plate precursors obtained was exposed using Luxel PLATESETTER T-6000lII manufactured by Fujifilm Corp., having mounted thereon an infrared semiconductor laser, under the conditions of a rotation speed of external drum of 1,000 rpm, a laser output of 70% and a resolution of 2,400 dpi. The exposed image was designed to contain a solid image and a 50% halftone dot chart of a 20 μm-dot FM screen.

The exposed plate precursor obtained was attached to the plate cylinder of a printing machine, LITHRONE 26, manufactured by Komori Corp., without applying development processing. Using, as the fountain solution, Ecolity-2 (produced by Fujifilm Corp.)/tap water=2/98 (volume ratio) and using Black Ink Values-G (N) (produced by Dainippon Ink & Chemicals, Inc.), on-press development was performed by supplying the fountain solution and the ink according to the standard automatic printing start method of LITHRONE 26 and thereafter, printing was performed on 100 sheets of TOKUBISHI ART (76.5 kg) paper at a printing speed of 10,000 sheets per hour.

The number of printed sheets required until completing on-press development of the unexposed area of the image-recording layer on the printing machine and reaching a state of no transfer of ink to the non-image area was measured as the on-press developability. The results are shown in Tables 2 to 4.

(3) Press Life

After evaluating the on-press developability above, printing was further continued. With an increase in the number of printed sheets, the image-recording layer was gradually abraded and in turn, the ink density on the printed matter was decreased. The number of printed sheets when the value obtained by measuring a halftone dot area rate of 50% halftone dot of FM screen on the printed matter by means of a Gretag densitometer was decreased by 5% from the value measured on the 100th printed sheet, was used as the final number of printed sheets for evaluating the press life. The results are shown in Tables 2 to 4.

TABLE 2

Example 2 to 21

| | Lithographic Printing Plate Precursor | Protective Layer Coating solution | Microgel Synthesized | Microgel (A) Polymer of Tg ≥ 50° C. | | (B) | (C) | (D) | ΔL | | | Press Life (ten thousands) | On-Press Developability (sheets) |
| | | | | Constituent Monomer | Tg (° C.) | Photo initiator | Infrared Absorbing Dye | Acid Color Former | Immediately After | After 2 Hours | After Forced Aging | | |
|---|---|---|---|---|---|---|---|---|---|---|---|---|---|
| Example 2 | (1) | (1) | MG-1 | M-1 | 105 | I-2 | IR-1 | none | 5.5 | 4.0 | 5.0 | 7 | 20 |
| Example 3 | (2) | (1) | MG-2 | M-2 | 117 | I-2 | IR-1 | none | 5.5 | 4.0 | 5.0 | 7 | 20 |
| Example 4 | (3) | (1) | MG-3 | M-2 | 117 | S-4 | IR-5 | none | 6.0 | 5.0 | 5.5 | 7 | 20 |
| Example 5 | (4) | (1) | MG-4 | M-2 | 117 | I-1 | IR-10 | none | 5.5 | 5.5 | 5.0 | 7 | 20 |
| Example 6 | (5) | (1) | MG-5 | M-2 | 117 | I-1 | IR-30 | none | 5.5 | 5.5 | 5.0 | 7 | 20 |
| Example 7 | (6) | (1) | MG-6 | M-2 | 117 | S-16 | IR-5 | none | 5.0 | 5.0 | 4.5 | 7 | 20 |
| Example 8 | (7) | (1) | MG-7 | M-2 | 117 | S-19 | IR-5 | none | 5.0 | 5.0 | 4.5 | 7 | 20 |
| Example 9 | (8) | (1) | MG-8 | M-2 | 117 | S-19 | IR-30 | none | 6.0 | 6.0 | 5.5 | 7 | 20 |
| Example 10 | (9) | (1) | MG-9 | M-2 | 117 | I-1 | IR-5 | SP-2 | 8.0 | 6.0 | 7.5 | 7 | 20 |
| Example 11 | (10) | (1) | MG-10 | M-2 | 117 | I-1 | IR-5 | SP-3 | 8.0 | 6.0 | 7.5 | 7 | 20 |
| Example 12 | (11) | (1) | MG-11 | M-2 | 117 | S-4 | IR-5 | SP-13 | 12.0 | 11.5 | 11.5 | 7 | 20 |
| Example 13 | (12) | (1) | MG-12 | M-3 | 87 | I-2 | IR-30 | SP-13 | 12.0 | 12.0 | 11.5 | 7 | 20 |
| Example 14 | (13) | (1) | MG-13 | M-4 | 77 | I-2 | IR-30 | SP-13 | 12.0 | 12.0 | 11.5 | 7 | 20 |
| Example 15 | (14) | (1) | MG-14 | M-5 | 54 | I-2 | IR-30 | SP-13 | 12.0 | 11.5 | 11.5 | 7 | 20 |
| Example 16 | (15) | (1) | MG-15 | M-6 | 127 | I-2 | IR-30 | SP-13 | 12.0 | 12.0 | 11.5 | 7 | 20 |
| Example 17 | (16) | (1) | MG-16 | M-7 | 77 | I-2 | IR-30 | SP-13 | 12.0 | 12.0 | 11.5 | 7 | 20 |
| Example 18 | (17) | (1) | MG-17 | M-8 | 89 | I-2 | IR-30 | SP-13 | 12.0 | 12.0 | 11.5 | 7 | 20 |
| Example 19 | (18) | (1) | MG-18 | M-9 | 165 | I-2 | IR-30 | SP-13 | 12.0 | 12.0 | 11.5 | 7 | 20 |
| Example 20 | (19) | (1) | MG-19 | M-10 | 147 | I-2 | IR-30 | SP-13 | 12.0 | 12.0 | 11.5 | 7 | 20 |
| Example 21 | (20) | (1) | MG-20 | M-11 | 97 | I-2 | IR-30 | SP-13 | 12.0 | 12.0 | 11.5 | 7 | 20 |

TABLE 3

Example 22 to 41

| | Lithographic Printing Plate Precursor | Protective Layer Coating solution | Microgel Synthesized | (A) Polymer of Tg ≥ 50° C. Constituent Monomer | Tg (° C.) | (B) Photo initiator | (C) Infrared Absorbing Dye | (D) Acid Color Former | ΔL Immediately After | ΔL After 2 Hours | ΔL After Forced Aging | Press Life (ten thousands) | On-Press Developability (sheets) |
|---|---|---|---|---|---|---|---|---|---|---|---|---|---|
| Example 22 | (21) | (1) | MG-21 | M-12 | 100 | I-2 | IR-30 | SP-13 | 12.0 | 12.0 | 11.5 | 7 | 20 |
| Example 23 | (22) | (1) | MG-22 | M-2 | 117 | I-1 | IR-1 | SP-23 | 11.0 | 9.0 | 10.5 | 7 | 20 |
| Example 24 | (23) | (1) | MG-23 | M-2 | 117 | I-2 | IR-1 | SP-23 | 11.0 | 9.0 | 10.5 | 7 | 20 |
| Example 25 | (24) | (1) | MG-24 | M-2 | 117 | S-3 | IR-5 | SP-23 | 9.0 | 6.0 | 8.5 | 7 | 20 |
| Example 26 | (25) | (1) | MG-25 | M-2 | 117 | S-4 | IR-5 | SP-23 | 12.0 | 10.0 | 11.5 | 7 | 20 |
| Example 27 | (26) | (1) | MG-26 | M-2 | 117 | S-10 | IR-5 | SP-23 | 9.0 | 6.0 | 8.5 | 7 | 20 |
| Example 28 | (27) | (1) | MG-27 | M-2 | 117 | S-16 | IR-5 | SP-23 | 11.0 | 11.0 | 10.5 | 7 | 20 |
| Example 29 | (28) | (1) | MG-28 | M-2 | 117 | S-19 | IR-5 | SP-23 | 12.0 | 12.0 | 11.5 | 7 | 20 |
| Example 30 | (29) | (1) | MG-29 | M-3 | 87 | S-4 | IR-1 | SP-13 | 12.0 | 9.0 | 11.5 | 7 | 20 |
| Example 31 | (30) | (1) | MG-30 | M-3 | 87 | S-4 | IR-2 | SP-13 | 10.0 | 7.0 | 9.5 | 7 | 20 |
| Example 32 | (31) | (1) | MG-31 | M-3 | 87 | S-4 | IR-4 | SP-13 | 10.0 | 7.0 | 9.5 | 7 | 20 |
| Example 33 | (32) | (1) | MG-32 | M-3 | 87 | S-4 | IR-5 | SP-13 | 12.0 | 9.0 | 11.5 | 7 | 20 |
| Example 34 | (33) | (1) | MG-33 | M-3 | 87 | S-4 | IR-7 | SP-13 | 13.0 | 10.0 | 12.5 | 7 | 20 |
| Example 35 | (34) | (1) | MG-34 | M-3 | 87 | S-4 | IR-10 | SP-13 | 12.0 | 12.0 | 11.5 | 7 | 20 |
| Example 36 | (35) | (1) | MG-35 | M-3 | 87 | S-4 | IR-18 | SP-13 | 11.5 | 11.5 | 11.0 | 7 | 20 |
| Example 37 | (36) | (1) | MG-36 | M-3 | 87 | S-4 | IR-30 | SP-13 | 12.0 | 12.0 | 11.5 | 7 | 20 |
| Example 38 | (37) | (1) | MG-37 | M-4 | 77 | S-4 | IR-5 | SP-1 | 12.0 | 9.0 | 11.5 | 7 | 20 |
| Example 39 | (38) | (1) | MG-38 | M-4 | 77 | S-4 | IR-5 | SP-2 | 10.0 | 7.0 | 9.5 | 7 | 20 |
| Example 40 | (39) | (1) | MG-39 | M-4 | 77 | S-4 | IR-5 | SP-3 | 10.0 | 7.0 | 9.5 | 7 | 20 |
| Example 41 | (40) | (1) | MG-40 | M-4 | 77 | S-4 | IR-5 | SP-6 | 12.0 | 12.0 | 11.5 | 7 | 20 |

TABLE 4

Example 42 to 54 and Comparative Example 4 to 10

| | Lithographic Printing Plate Precursor | Protective Layer Coating solution | Microgel Synthesized | (A) Polymer of Tg ≥ 50° C. Constituent Monomer | Tg (° C.) | (B) Photo initiator | (C) Infrared Absorbing Dye | (D) Acid Color Former | ΔL Immediately After | ΔL After 2 Hours | ΔL After Forced Aging | Press Life (ten thousands) | On-Press Developability (sheets) |
|---|---|---|---|---|---|---|---|---|---|---|---|---|---|
| Example 42 | (41) | (1) | MG-41 | M-4 | 77 | S-4 | IR-5 | SP-11 | 12.0 | 12.0 | 11.5 | 7 | 20 |
| Example 43 | (42) | (1) | MG-42 | M-4 | 77 | S-4 | IR-5 | SP-13 | 12.0 | 12.0 | 11.5 | 7 | 20 |
| Example 44 | (43) | (1) | MG-43 | M-4 | 77 | S-4 | IR-5 | SP-23 | 12.0 | 12.0 | 11.5 | 7 | 20 |
| Example 45 | (44) | (1) | MG-44 | M-4 | 77 | S-4 | IR-5 | SP-26 | 10.0 | 10.0 | 9.5 | 7 | 20 |
| Example 46 | (45) | (1) | MG-45 | M-4 | 77 | S-4 | IR-5 | SP-32 | 12.0 | 12.0 | 11.5 | 7 | 20 |
| Example 47 | (46) | (1) | MG-46 | M-4 | 77 | S-4 | IR-5 | SP-33 | 12.0 | 12.0 | 11.5 | 7 | 20 |
| Example 48 | (47) | (1) | MG-47 | M-4 | 77 | S-4 | IR-5 | SP-36 | 9.0 | 9.0 | 7.5 | 7 | 20 |
| Example 49 | (48) | (1) | MG-48 | M-1/M-2 | 114 | I-1 | IR-1 | SP-13 | 11.0 | 11.0 | 10.5 | 7 | 20 |
| Example 50 | (49) | (1) | MG-49 | M-1/M-3 | 91 | I-1 | IR-1 | SP-13 | 11.0 | 11.0 | 10.5 | 7 | 20 |
| Example 51 | (50) | (1) | MG-50 | M-1/M-5 | 63 | I-1 | IR-1 | SP-13 | 11.0 | 11.0 | 10.5 | 7 | 20 |
| Example 52 | (51) | (1) | MG-51 | M-1/M-8 | 94 | I-1 | IR-1 | SP-13 | 11.0 | 11.0 | 10.5 | 7 | 20 |
| Example 53 | (52) | (2) | MG-2 | M-2 | 117 | I-2 | IR-1 | none | 5.5 | 4.5 | 4.0 | 1 | 50 |
| Example 54 | (53) | (2) | MG-23 | M-2 | 117 | I-2 | IR-1 | SP-23 | 11.0 | 10.0 | 9.5 | 1 | 50 |
| Comparative Example 4 | (54) | (1) | MG-54 | none | — | I-2 | IR-1 | none | 5.0 | 1.5 | 1.5 | 5 | 20 |
| Comparative Example 5 | (55) | (1) | MG-55 | none | — | I-2 | IR-1 | SP-13 | 10.0 | 3.5 | 1.5 | 5 | 20 |
| Comparative Example 6 | (56) | (1) | MG-56 | M-2 | 117 | I-2 | none | none | 0.0 | 0.0 | 0.0 | 7 | 20 |
| Comparative Example 7 | (57) | (1) | MG-57 | M-2 | 117 | none | IR-1 | none | 0.5 | 0.5 | 0.5 | 7 | 20 |
| Comparative Example 8 | (58) | (1) | MG-58 | M-1/M-14 | 44 | I-2 | IR-1 | none | 5.0 | 1.5 | 1.5 | 5 | 20 |
| Comparative Example 9 | (59) | (1) | MG-59 | M-13 | 27 | I-2 | IR-1 | none | 5.0 | 1.5 | 1.5 | 5 | 20 |
| Comparative Example 10 | (60) | (1) | MG-60 | M-14 | −3 | I-2 | IR-1 | none | 5.0 | 1.5 | 1.5 | 5 | 20 |

Incidentally, microgels MG-2 to MG-9, MG-11 to MG-47, MG-52, MG-53, MG-55 and MG-60 in Tables 2 to 4 were synthesized in the same manner as microgels MG-1 or MG-10 except for using those shown in Table 1 as the components (A) to (D).

As apparent from the results in Tables 2 to 4, when the lithographic printing plate precursor of the present invention is used, high coloring is obtained and moreover, high coloring is maintained even with the elapse of time after coloring. Furthermore, storage stability is good and high coloring is obtained even when a lithographic printing plate precursor after elapse of time is exposed. In addition, unexpectedly, the microgel encapsulating a monomer enhances also the printing durability.

INDUSTRIAL APPLICABILITY

A solution obtained by dissolving or dispersing the coloring photosensitive composition of the present invention in an appropriate solvent is coated on a support or the like and dried to form a coloring photosensitive composition film, whereby an image forming material is produced. The image forming material includes an image forming material utilizing coloring and polymerization/curing by imagewise exposure to an infrared ray, such as lithographic printing plate precursor, printed circuit board, color filter and photomask. Above all, the composition is suitable for the production of a lithographic printing plate precursor.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2010-65206) filed on Mar. 19, 2010, the contents of which are incorporated herein by way of reference.

The invention claimed is:

1. A coloring photosensitive composition comprising a microgel encapsulating the following (A) to (C), and a binder polymer:

(A) a polymer having a glass transition temperature of 50° C. or more, (B) a photoinitiator, and (C) an infrared absorbing dye;

wherein the polymer (A) is an acrylic resin.

2. The coloring photosensitive composition as claimed in claim 1, wherein the infrared absorbing dye contains, in a molecule of the dye, at least one selected from the group consisting of a hydroxy group, an amino group, an isocyanate group and a terminal ethylenically unsaturated bonding group.

3. The coloring photosensitive composition as claimed in claim 1, wherein the infrared absorbing dye is a cyanine dye.

4. The coloring photosensitive composition as claimed in claim 3, wherein the infrared absorbing dye is a cyanine dye represented by the following formula (1):

Formula (1):

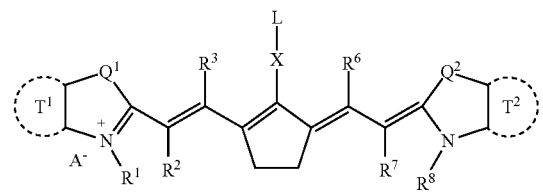

wherein $R^1$ and $R^8$ represents a monovalent substituent; each of $R^2$, $R^3$, $R^6$ and $R^7$ independently represents a hydrogen atom or a hydrocarbon group; X represents an oxygen atom, a nitrogen atom or a sulfur atom; L represents an aromatic hydrocarbon ring, a heteroaromatic ring or a heteroatom-containing alkyl group having a carbon atom number of 1 to 12, provided that when X is a nitrogen atom, —N(L1)(L2) results, and L1 and L2 may be same or different and represent the same substituent as L; $Q^1$ and $Q^2$ may be same or different and represent —$NR^9$—, a sulfur atom, an oxygen atom or a dialkylmethylene group, and $R^9$ represents a hydrogen atom or a hydrocarbon group which may have a substituent; each of $T^1$ and $T^2$ independently represents an aromatic ring or a heteroaromatic ring, and the ring may further have a substituent; $A^-$ represents a counter ion; and in the molecule, at least one of $T^1$, $T^2$, $R^1$, $R^8$ and L has a hydroxy group, an amino group, an isocyanate group or a terminal ethylenically unsaturated bonding group.

5. The coloring photosensitive composition as claimed in claim 1, wherein the photoinitiator is an iodonium salt or a sulfonium salt.

6. The coloring photosensitive composition as claimed in claim 5, wherein the photoinitiator has, in a molecule of the photoinitiator, at least one selected from the group consisting of a hydroxy group, an isocyanate group and a terminal ethylenically unsaturated bonding group.

7. The coloring photosensitive composition as claimed in claim 1, wherein the microgel further encapsulates (D) an acid color former.

8. The coloring photosensitive composition as claimed in claim 7, wherein the acid color former (D) is at least one compound selected from the group consisting of a spiropyran compound and a spirooxazine compound.

9. The coloring photosensitive composition as claimed in claim 8, wherein the spiropyran compound and the spirooxazine compound have, in a molecule thereof, at least one selected from the group consisting of a hydroxy group, an amino group, an isocyanate group and a terminal ethylenically unsaturated bonding group.

10. A lithographic printing plate precursor comprising, in the following order: a support; and an image-recording layer containing the coloring photosensitive composition claimed in claim 1.

11. The lithographic printing plate precursor as claimed in claim 10, wherein the image-recording layer further contains, outside the microgel, (B) a photoinitiator and (C) an infrared absorbing dye, each of which may be the same or different from that within the microgel, and (E) a polymerizable compound.

12. The lithographic printing plate precursor as claimed in claim 11, comprising a protective layer on the image-recording layer.

13. The lithographic printing plate precursor as claimed in claim 12, wherein the protective layer contains an inorganic layered compound.

14. A color image forming method comprising imagewise-exposing the coloring photosensitive composition claimed in claim 1 to cause coloring of the exposed area.

15. A plate making method comprising: imagewise-exposing the lithographic printing plate precursor claimed in claim 10 to cause coloring of the exposed area; and then performing development processing.

16. A plate making method comprising performing on-press development processing by either a method where the lithographic printing plate precursor claimed in claim 10 is imagewise-exposed to cause coloring of the exposed area and then loaded on a printing machine and thereafter, a printing ink and a fountain solution are supplied, or a method where the lithographic printing plate precursor is loaded on a printing machine and then imagewise-exposed to cause coloring of the exposed area and thereafter, a printing ink and a fountain solution are supplied.

17. The coloring photosensitive composition as claimed in claim 2, wherein the infrared absorbing dye is a cyanine dye.

18. The coloring photosensitive composition as claimed in claim 2, wherein the photoinitiator is an iodonium salt or a sulfonium salt.

19. The coloring photosensitive composition as claimed in claim 3, wherein the photoinitiator is an iodonium salt or a sulfonium salt.

20. The coloring photosensitive composition as claimed in claim 4, wherein the photoinitiator is an iodonium salt or a sulfonium salt.

\* \* \* \* \*